(12) United States Patent
Yamaguchi

(10) Patent No.: US 8,274,137 B2
(45) Date of Patent: Sep. 25, 2012

(54) POWER SEMICONDUCTOR DEVICE

(75) Inventor: Hiroshi Yamaguchi, Tokyo (JP)

(73) Assignee: Mitsubishi Electric Corporation (JP)

( * ) Notice: Subject to any disclaimer, the term of this patent is extended or adjusted under 35 U.S.C. 154(b) by 0 days.

(21) Appl. No.: 13/273,068

(22) Filed: Oct. 13, 2011

(65) Prior Publication Data

US 2012/0025263 A1 Feb. 2, 2012

Related U.S. Application Data

(62) Division of application No. 12/395,946, filed on Mar. 2, 2009.

(30) Foreign Application Priority Data

| May 20, 2008 | (JP) | 2008-132151 |
| Sep. 18, 2008 | (JP) | 2008-239098 |

(51) Int. Cl.
 *H01L 29/10* (2006.01)
(52) U.S. Cl. ........... 257/565; 257/139; 257/E29.066
(58) Field of Classification Search ............ 257/139, 257/140–144, 565
See application file for complete search history.

(56) References Cited

U.S. PATENT DOCUMENTS

| 2003/0089994 A1 | 5/2003 | Macheel et al. |
| 2004/0232484 A1* | 11/2004 | Zommer et al. ......... 257/341 |
| 2004/0262720 A1 | 12/2004 | Satou et al. |
| 2005/0073279 A1 | 4/2005 | Fenley |
| 2008/0079066 A1* | 4/2008 | Hamaguchi et al. ......... 257/330 |

FOREIGN PATENT DOCUMENTS

| JP | 08-078619 | 3/1996 |
| JP | 2004-363327 A1 | 12/2004 |
| KR | 10-0745557 | 8/2007 |

OTHER PUBLICATIONS

Korean Office Action; KR10-0043856; Nov. 16, 2010.
G.Harman; "Wire Bonding in Microelectronics"; McGraw-Hill; USA; Dec. 31, 1997; pp. 58-59 and 232-235.
European Office Action; EP09003307.7; Oct. 12, 2010.
Office Action "Summons to attend oral proceedings pursuant to Rule 115(1) EPC" issued by European Patent Office on May 4, 2012; Application No./Patent No. 10176985.9-2203/2284900.
B. Jayant Baliga; "Power Semiconductor Devices"; PWS Publishing Company; Dec. 31, 1995; pp. 436-440; Boston, MA.
B. Jayant Baliga; "Fundamentals of Power Semiconductor Devices"; Springer; Sep. 5, 2008; p. 987; New York, NY.

* cited by examiner

*Primary Examiner* — Jarrett Stark
*Assistant Examiner* — Lawrence Tynes, Jr.
(74) *Attorney, Agent, or Firm* — Studebaker & Brackett PC; Donald R. Studebaker

(57) ABSTRACT

A plurality of cell structures of a vertical power device are formed at a semiconductor substrate. One cell structure included in the plurality of cell structures and located in a central portion CR of the main surface has a lower current carrying ability than the other cell structure included in the plurality of cell structures and located in an outer peripheral portion PR of the main surface. This provides a power semiconductor device having a long power cycle life.

12 Claims, 39 Drawing Sheets

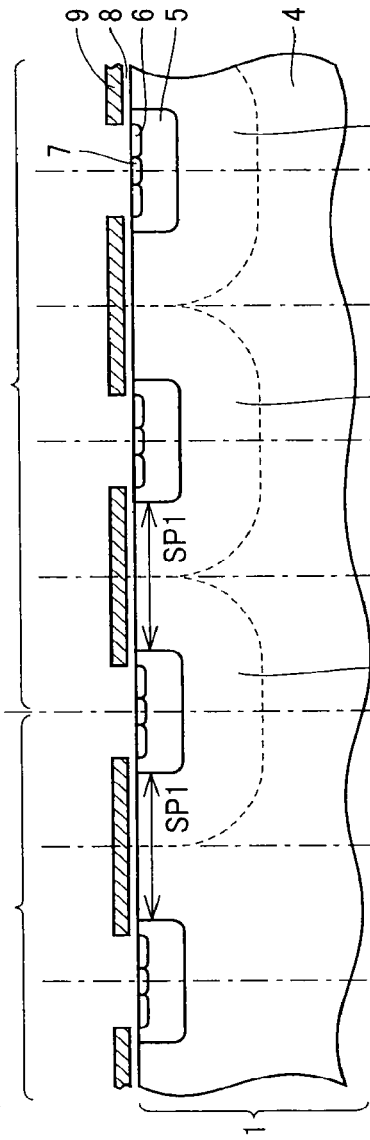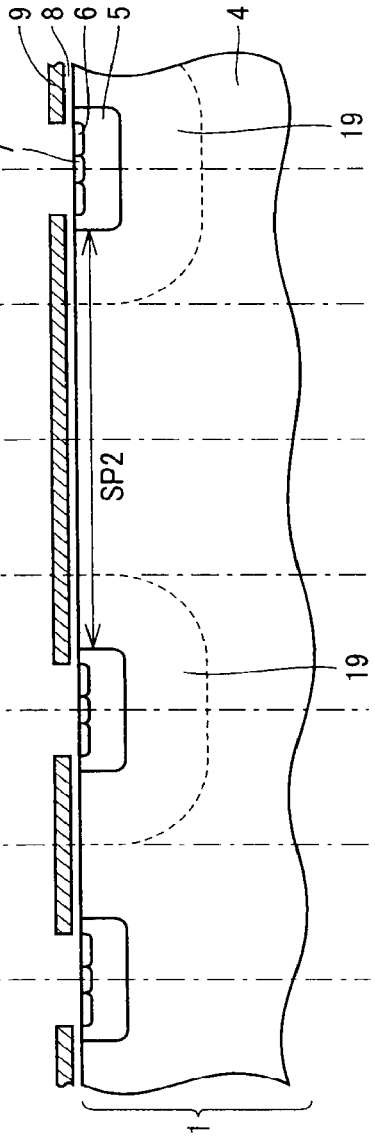

※$L_0 < L_1$

※$P_0 < P_1$

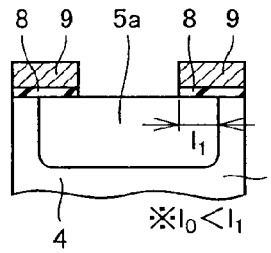
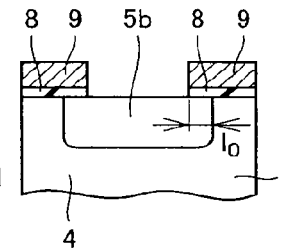
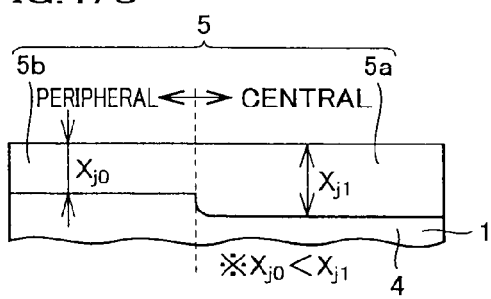
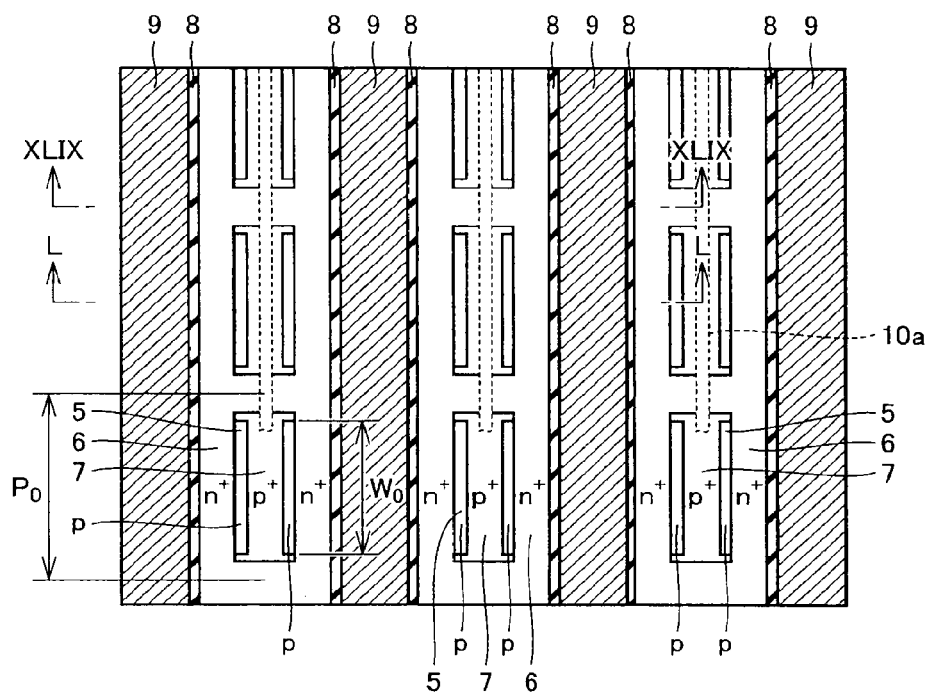

POWER SEMICONDUCTOR DEVICE

BACKGROUND OF THE INVENTION

1. Field of the Invention

The present invention relates to a power semiconductor device, and particularly to a power semiconductor device provided with a vertical power device.

2. Description of the Background Art

As power devices, there have been power diodes, power MOSFETs (Metal Oxide Semiconductor Field Effect Transistors), IGBTs (Insulated Gate Bipolar Transistors) and the like, and a structure that has only one or a plurality of such device(s) (chip(s)) as well as one package accommodating the device(s) together with desired wiring has been generally referred to as a power semiconductor device.

A "power cycle life" is one of indexes that are used when reliability of the power semiconductor devices are considered. This power cycle life represents a life determined in connection with a wire that is joined as a part of interconnections to an electrode of a chip, and particularly is a life that expires when peeling or breakage of the wire occurs on or near a joining interface of the wire due to frequent changes in temperature according to operations. For example, in the IGBT, the power cycle life depends on a temperature (Tj) of a region where an emitter electrode is joined to an emitter wire, and increases with decrease in $\Delta Tj (= Tj_{max} - Tj_{min})$. It has also been known that the power cycle life increases with decrease in $Tj_{max}$ even when $\Delta Tj$ is constant. For example, Japanese Patent Laying-Open No. 2004-363327 has disclosed a power device developed in view of improvement of the above power cycle life.

For example, in a power semiconductor device having a plurality of wires (emitter wires) connected to emitter electrodes of an IGBT chip, a current gathers at connection portions of the emitter wires so that a temperature Tja of the emitter wire connection portions is higher than a temperature Tjb of their surrounding region. Consequently, values of $Tj_{max}$ and $\Delta Tj$ increase, resulting in a problem that the power cycle life decreases.

SUMMARY OF THE INVENTION

The invention has been made in view of the above object, and an object of the invention is to provide a power semiconductor device having a good power cycle life.

A power semiconductor device according to the invention includes a semiconductor substrate, and a plurality of cell structures of a vertical power device formed at the semiconductor substrate. The semiconductor substrate has a main surface. One cell structure included in the plurality of cell structures and located in a central portion of the main surface has a lower current carrying ability than the other cell structure included in the plurality of cell structures and located in an outer peripheral portion of the main surface.

Another power semiconductor device according to the invention includes a semiconductor substrate, and a plurality of cell structures of a vertical power device formed at the semiconductor substrate. The semiconductor substrate has a main surface. One cell structure included in the plurality of cell structures and located immediately under a wire joining portion has a lower current carrying ability than the other cell structure included in the plurality of cell structures and not located immediately under the wire joining portion.

Still another power semiconductor device according to the invention includes a semiconductor substrate, and a plurality of cell structures of a vertical power device formed at the semiconductor substrate. The semiconductor substrate has a main surface. A plurality of wire joining portions including one wire joining portion and the other wire joining portion are present at the main surface. The one cell structure included in the plurality of cell structures and located immediately under the one wire joining portion has a current carrying ability different from that of the other cell structure included in the plurality of cell structures and located immediately under the other wire joining portion.

According to the invention, the current carrying abilities of the plurality of cell structures change according to a thermal resistance at the main surface of the semiconductor substrate, and thereby the temperature distribution at the main surface of the semiconductor substrate can be uniformized so that the power semiconductor device having a good power cycle life can be achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9A is a schematic cross section of a structure having unit cells arranged at the same pitch in a central portion CR and an outer peripheral portion PR.

FIG. 9B is a schematic cross section of a structure having the unit cells arranged in central portion CR at pitches different from those of the unit cells arranged in outer peripheral portion PR.

FIGS. 47A, 47B and 47C are schematic sections showing a fifth step in the manufacturing method of the structure shown in FIG. 42.

FIG. 48 is a schematic plan showing a first structure of the memory cell (IGBT or power MOSFET) of the trench gate type that can employ the structures of the first to third embodiments.

DESCRIPTION OF THE PREFERRED EMBODIMENTS

Embodiments of the invention will be described below with reference to the drawings.

First Embodiment

Figure 1:
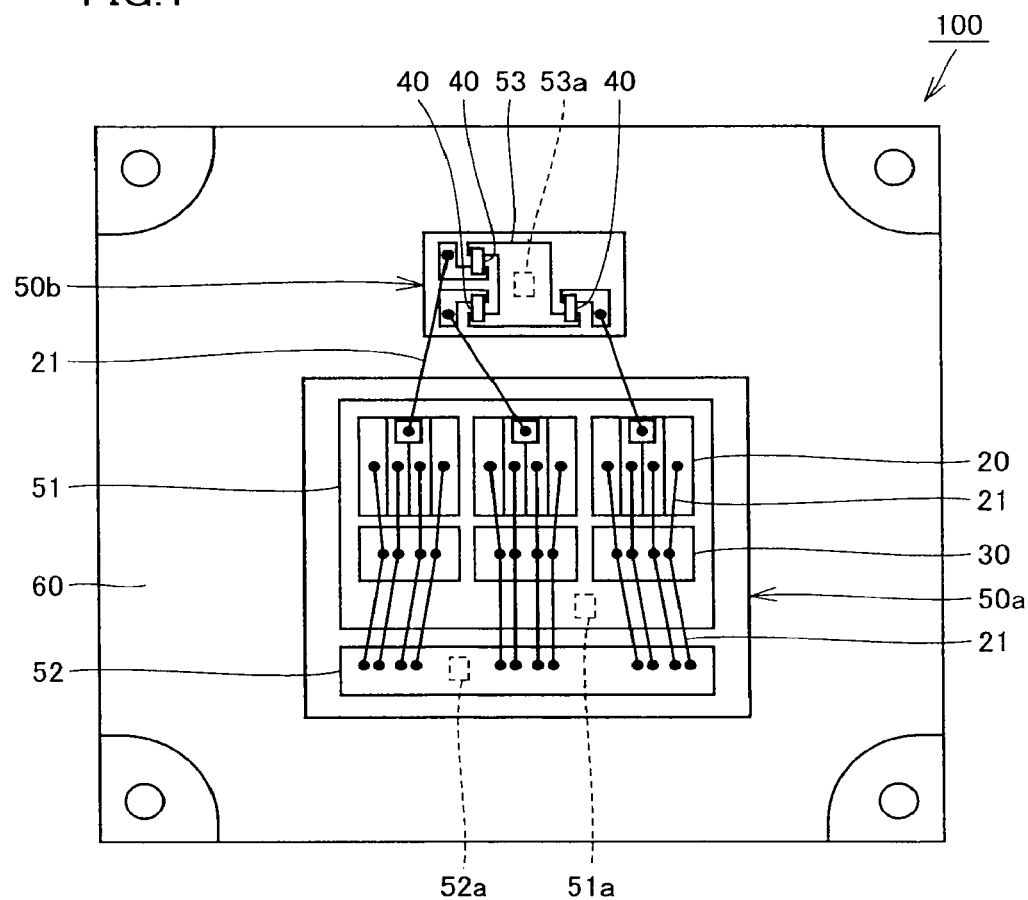
FIG. 1 is a schematic plan showing a schematic structure of a module forming a power semiconductor device in a first embodiment of the invention.
Figure 2:
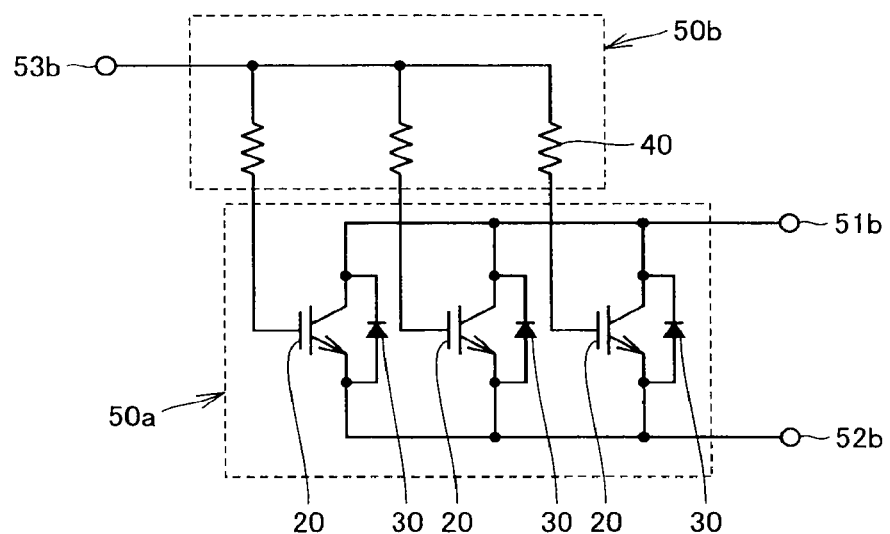
FIG. 2 shows an equivalent circuit of the power semiconductor device in FIG. 1.

Referring to FIGS. 1 and 2, this module 100 is a power module, and primarily has power devices 20, reflux diodes 30 and resistance elements 40.

Power device 20 is, e.g., an IGBT. IGBT 20 and reflux diode 30 are connected in anti-parallel with each other, and are arranged on a common insulating substrate 50a. More specifically, a collector electrode of IGBT 20 and a cathode electrode of diode 30 are both connected electrically to a conductive pattern 51 on insulating substrate 50a. An emitter electrode of IGBT 20 and an anode electrode of diode 30 are electrically connected together by a wire (a so-called boding dire) 21. The anode electrode of diode 30 is electrically connected by wire 21 to a conductive pattern 52 on insulating substrate 50a.

A resistance element 40 is electrically connected to a gate of IGBT 20 by wire 21. Resistance element 40 is electrically connected to a conductive pattern 53 on an insulating substrate 50b.

A part of conductive pattern 51 forms an external collector main electrode terminal leading region 51a, where a main terminal 51b is electrically connected to conductive pattern 51. A part of conductive pattern 52 forms an external emitter main electrode terminal leading region 52a, where a main terminal 52b is electrically connected to conductive pattern 52. A part of conductive pattern 53 forms a control electrode terminal leading region 53a, where a control terminal 53b is electrically connected to conductive pattern 53.

IGBTs 20, reflux diodes 30, resistance elements 40 and insulating substrates 50a and 50b described above are arranged on a base plate 60.

Then, description will be given on a structure of a chip that is used in the above power module and forms power device 20.

Figure 3:
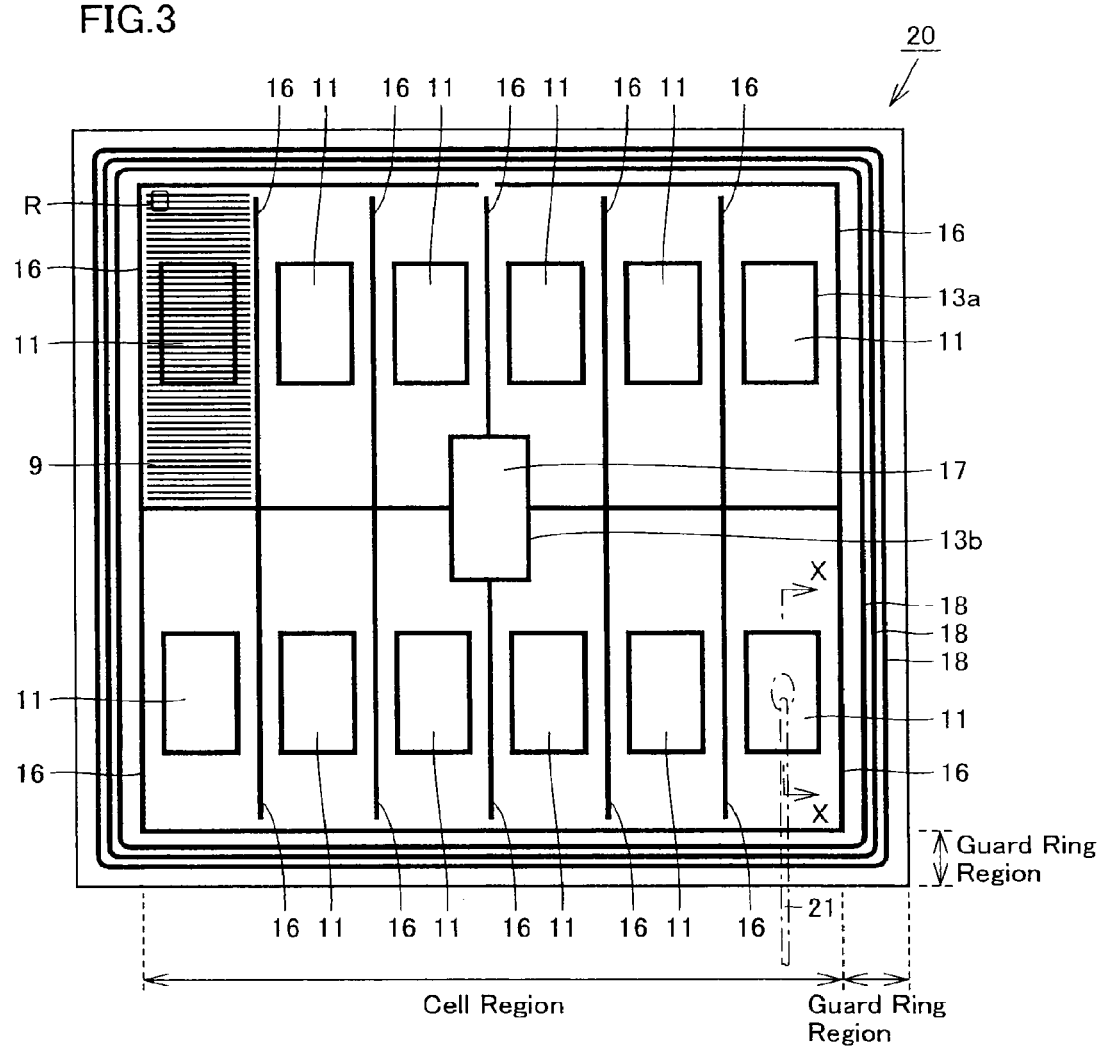
FIG. 3 is a schematic plan showing the power semiconductor device of the first embodiment of the invention, and particularly a schematic structure of a chip equipped with a power device and forming.
Figure 4:
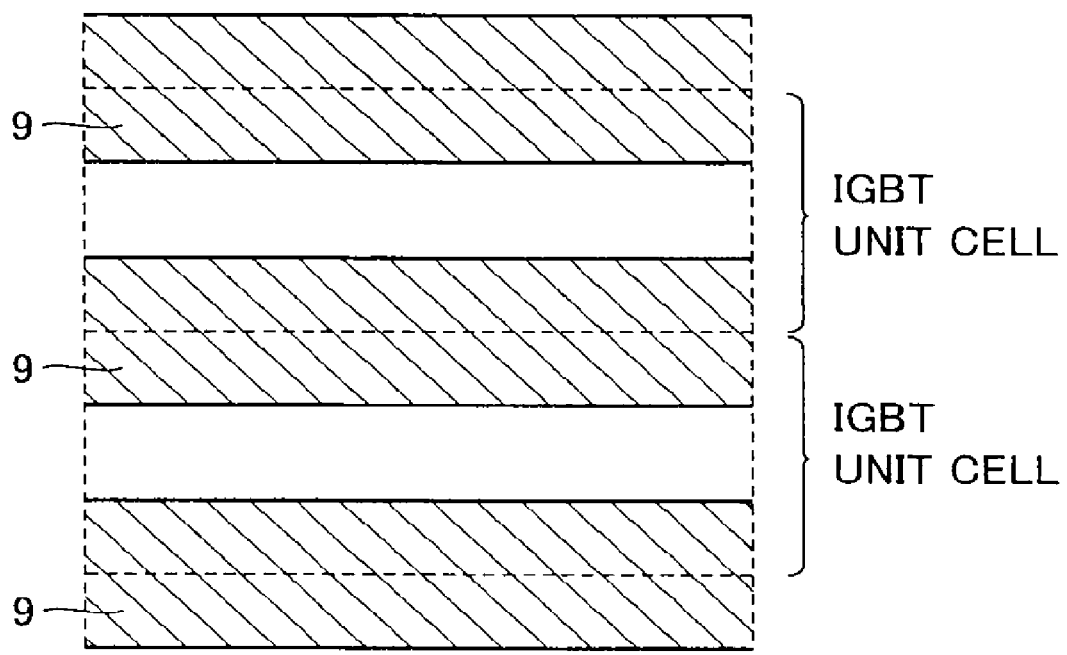
FIG. 4 is a fragmentary plan showing, on an enlarged scale, a region R in FIG. 3.

Referring to FIGS. 3 and 4, this chip 20 is, e.g., an IGBT chip provided with an IGBT as the power device. IGBT chip 20 has a cell region and a guard ring region.

In the cell region, a plurality of IGBT unit cells arranged in rows and columns are formed at a main surface of chip 20. A plurality of emitter pads 11 and, e.g., one gate pad 17 are arranged in the cell region. Each of emitter pads 11 is electrically connected to emitter regions of the plurality of IGBT unit cells, respectively. Gate pad 17 is electrically connected to a gate electrode layer 9 of each IGBT unit cell via a gate conductive layer 16.

A passivation film (not shown) is formed over these emitter pads 11 and gate pad 17. This passivation film is provided with openings 13a and 13b for exposing surfaces of emitter pads 11 and gate pad 17. Each of surfaces of emitter pads 11 and gate pad 17 exposed through the openings in the passivation film is used for connecting wire 21.

The guard ring region surrounds the outer periphery of the cell region. In this guard ring region, a plurality of guard rings 18 surrounding the outer periphery of the cell region are formed at the main surface of the semiconductor substrate.

Then, the structure of the unit cell of above power device 20 will be described.

Figure 5:
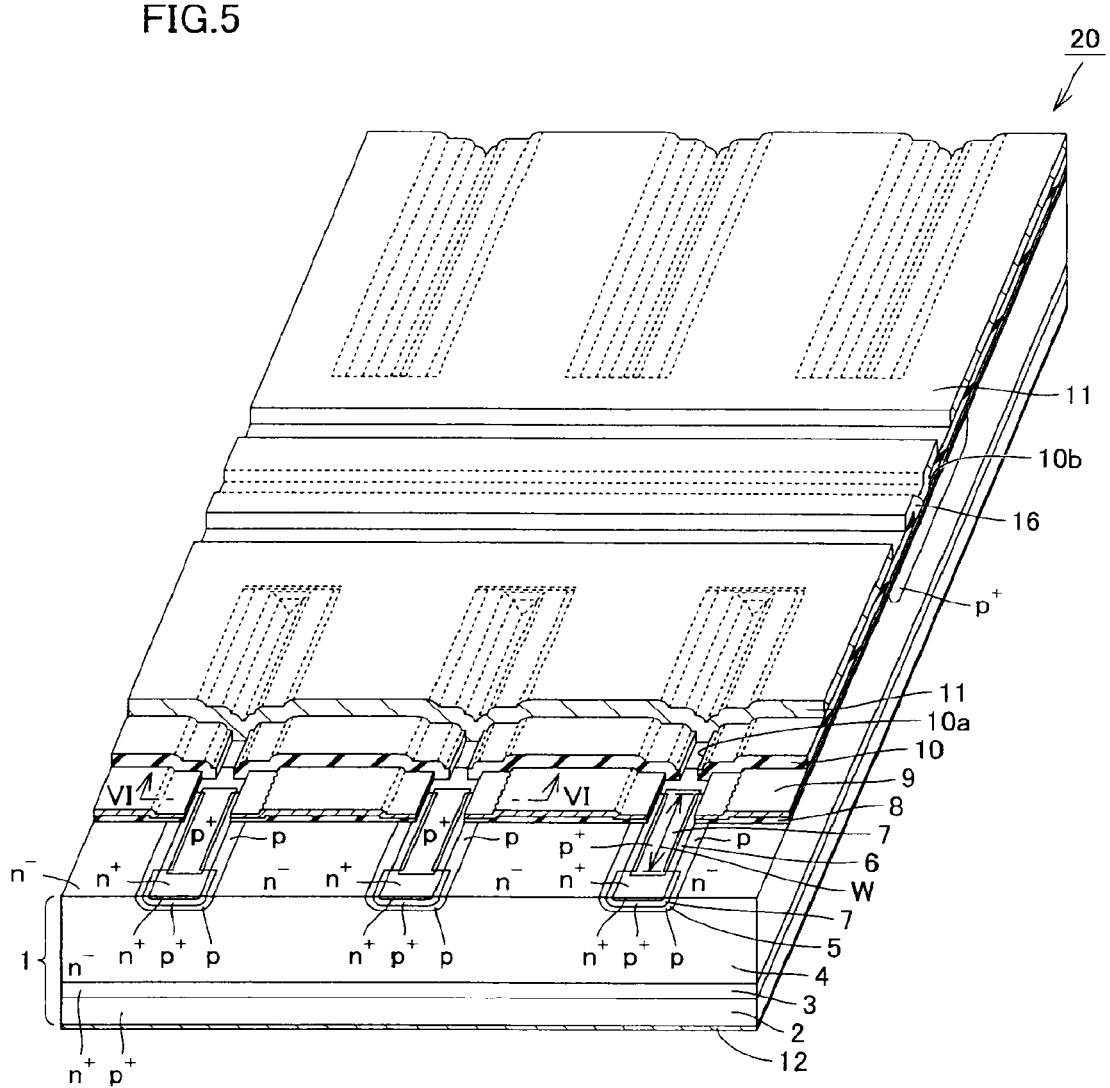
FIG. 5 is a perspective view schematically showing a structure of a cell region of the chip equipped with the power device shown in FIGS. 3 and 4 with a certain part cut away.
Figure 6:
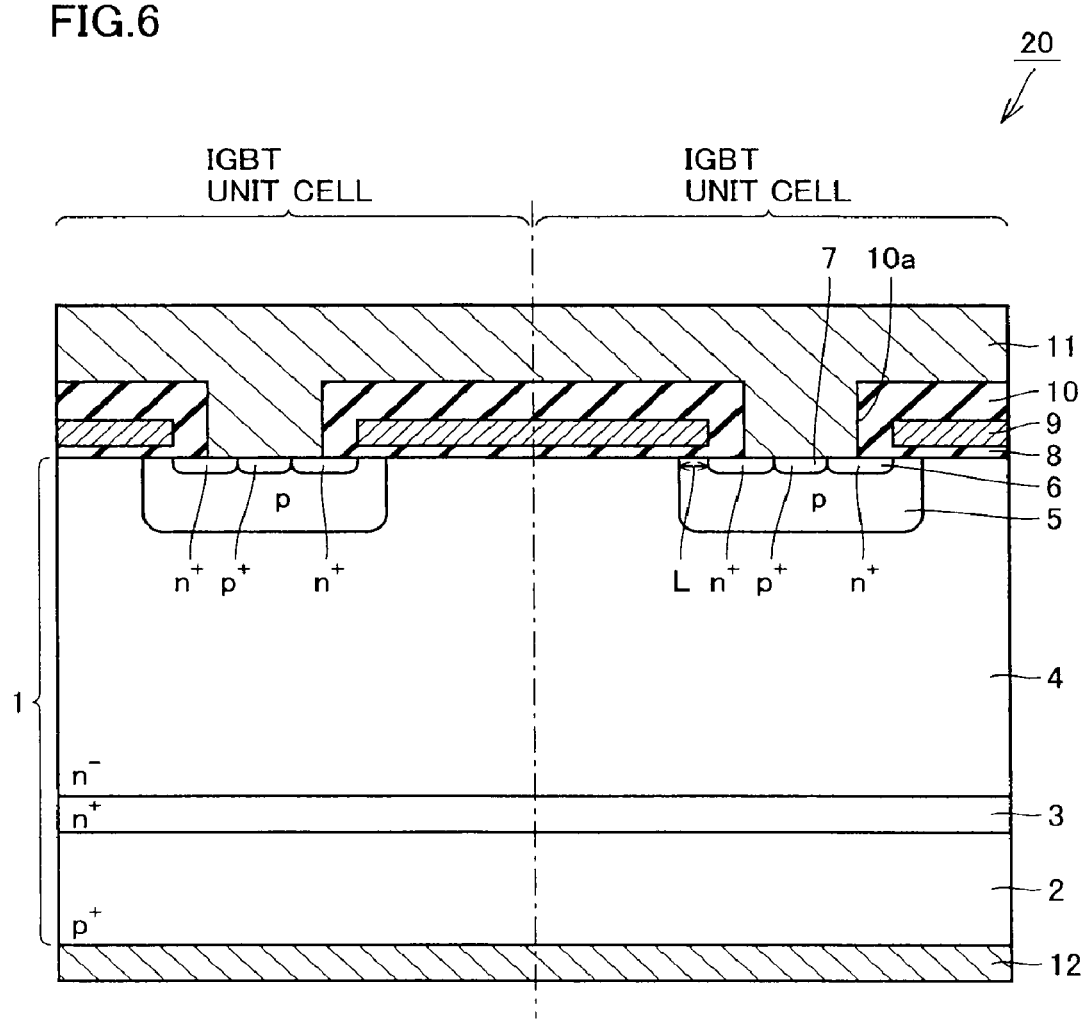
FIG. 6 is a schematic cross section taken along line VI-VI in FIG. 5.

Referring to FIGS. 5 and 6, a plurality of unit cells of a vertical power device are formed in the cell region on a semiconductor substrate 1 made of, e.g., silicon. This vertical power device is, e.g., a vertical IGBT.

Each of the plurality of IGBT unit cells primarily has a $n^+$ collector region 2, an $n^+$ epitaxial taxial region 3, an $n^-$ epitaxial region 4, a p-type base region 5, an $n^+$ emitter region 6, a $p^+$ region 7, a gate insulating film 8, gate electrode layer 9, emitter electrode (emitter pad) 11 and a collector electrode 12.

$n^-$ epitaxial region 4 is formed on $p^+$ collector region 2 with $n^+$ epitaxial region 3 therebetween. This $n^-$ epitaxial region 4 is located at a part of the main surface of semiconductor substrate 1. $p^+$ collector region 2 is located at the rear surface of semiconductor substrate 1.

p-type base region 5 is formed at the main surface of semiconductor substrate 1 to form a pn junction together with $n^-$ epitaxial region 4. $n^+$ emitter region 6 is formed at the main surface of semiconductor substrate 1 to form a pn junction together with p-type base region 5, and is spaced from $n^-$ epitaxial region 4 with p-type base region 5 therebetween. $p^+$ region 7 has a higher p-type impurity concentration than p-type base region 5, and is formed at the main surface of semiconductor substrate 1 within p-type base region 5.

Gate electrode layer 9 is formed on the main surface of semiconductor substrate 1 with gate insulating film 8 therebetween, and particularly is located on p-type base region 5 between $n^-$ epitaxial region 4 and $n^+$ emitter region 6. This gate electrode layer 9 that is formed on the main surface of semiconductor substrate 1 with gate insulating film 8 therebetween is also located on $n^-$ epitaxial region 4 between p-type base regions 5.

$n^-$ epitaxial region 4, p-type base region 5, $n^+$ emitter region 6, gate insulating film 8 and gate electrode layer 9 described above form an insulated gate field-effect transistor unit.

An insulating film 10 made of, e.g., PSG (Phospho-Silicate Glass) is formed on the main surface of semiconductor substrate 1 to cover gate electrode layer 9. Insulating film 10 is provided with contact holes 10a each exposing respective surfaces of $n^+$ emitter regions 6 and $p^+$ region 7. An emitter pad 11 is formed on insulating film 10 to connect electrically $n^+$ emitter region 6 to $p^+$ region 7 through contact hole 10a.

Insulating film 10 is also provided with contact holes 10b exposing the surface of gate electrode layer 9. Gate conductive layer 16 is formed on insulating film 10 and is electrically connected to gate electrode layer 9 through control 10b.

Collector electrode 12 is formed on a rear surface of semiconductor substrate 1 and is electrically connected to collector region 2.

In this embodiment, a cell structure located in a central portion of the cell region is configured to have a lower current carrying ability than a cell structure located at a peripheral portion of the cell region. This will be described below.

Figure 7:
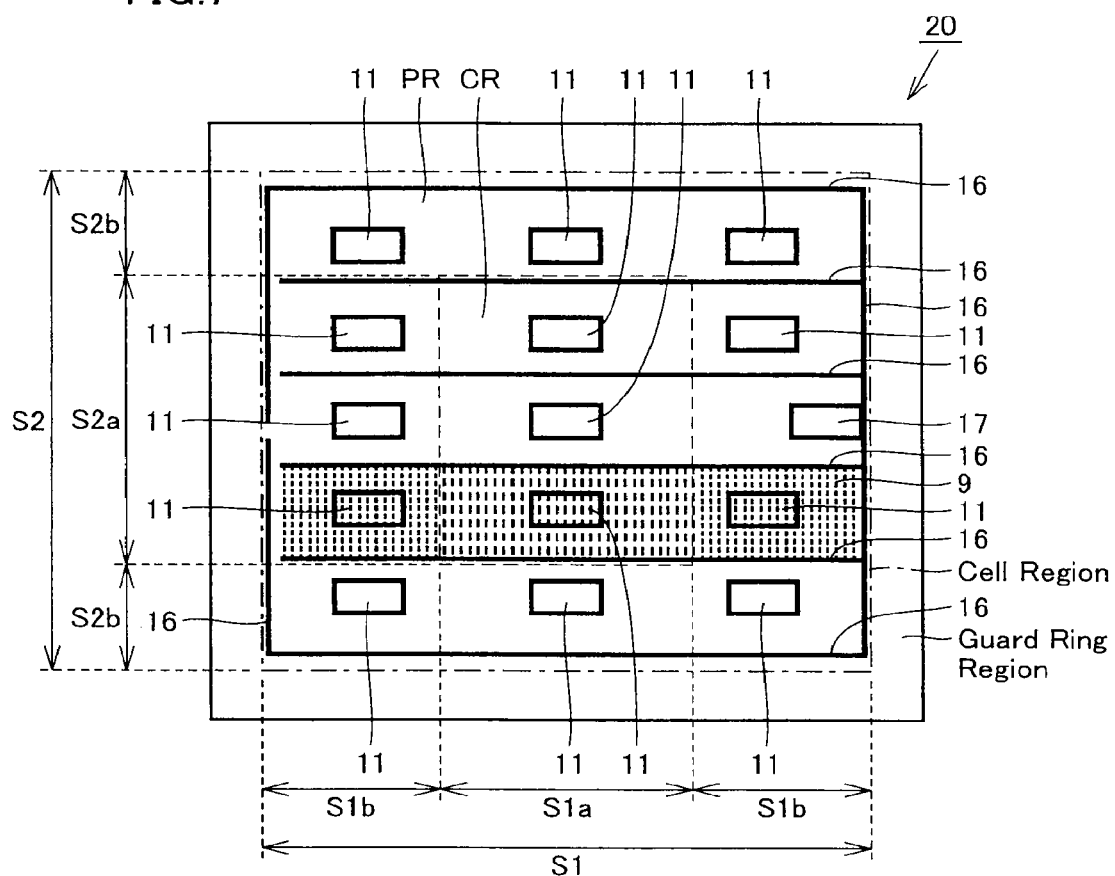
FIG. 7 is a schematic plan showing central and outer peripheral portions of a cell region of an IGBT in the power semiconductor device according to the first embodiment of the invention.

Referring to FIG. 7, IGBT chip 20 has a cell region and a guard ring region. The cell region is provided with a plurality of IGBT unit cells that are formed at the main surface of chip 20 and are arranged in rows and columns. The plurality of emitter pads 11 and, e.g., one gate pad 17 are arranged in the cell region. Emitter pads 11 are electrically connected to emitter regions of the plurality of IGBT unit cells, respectively. Gate pad 17 is electrically connected to gate electrode layer 9 of each of the IGBT unit cells via gate conductive layer 16.

On the main surface of the semiconductor substrate, the cell region has a central portion CR and an outer peripheral portion PR surrounding central portion CR. Emitter pads 11 are formed in each of central portion CR and outer peripheral portion PR. Gate pad 17 may be formed in either central portion CR or outer peripheral portion PR. This IGBT chip 20 has gate pad 17 formed in outer peripheral portion PR, and differs in this structure from IGBT chip 20 in FIG. 3.

The structure in which gate pad 17 is arranged in the central portion as shown in FIG. 3 can reduce ununiformity in distance from gate pad 17 to gate electrode layer 9, and can suppress voltage lowering in each gate electrode layer 9. The structure having gate pad 17 that is arranged in outer peripheral portion PR as shown in FIG. 7 allows relatively easy assembly even when bonding wires connected to respective emitter pads 11 are close to each other. IGBT chip 20 in either of FIGS. 3 and 7 may be used based on comparison and consideration of these merits.

As shown in FIG. 7, it is now assumed that the cell region at the main surface of semiconductor substrate 1 has a lateral size (in FIG. 7) of S1, central portion CR has a lateral size (in FIG. 7) of S1$a$ and outer peripheral portion PR has a lateral size (in FIG. 7) of S1$b$. Thus, there is a relationship of (S1=S1$a$+2×S1$b$). It is also assumed that the cell region at the main surface of semiconductor substrate 1 has a longitudinal size (in FIG. 7) of S2, central portion CR has a longitudinal size (in FIG. 7) of S2$a$ and outer peripheral portion PR has a longitudinal size (in FIG. 7) of S2$b$. Thus, there is a relationship of (S2=S2$a$+2×S2$b$).

In this case, lateral size S1$a$ (in FIG. 7) of central portion CR is equal to, e.g., (S1×4/5), and lateral size S1$b$ (in FIG. 7) of outer peripheral portion PR is equal to, e.g., (S1×1/10). Longitudinal size S2$a$ (in FIG. 7) of central portion CR is equal to, e.g., (S2×4/5), and longitudinal size S2$b$ (in FIG. 7) of outer peripheral portion PR is equal to, e.g., (S2×1/10).

The current carrying ability of the unit cell is evaluated based on a collector current Ic. Collector current Ic is represented by (Ic∝W($V_{GE}$−$V_{TH}$)$^2$/L), where W represents a channel width, L represents a channel length, $V_{TH}$ represents a gate threshold voltage and $V_{GE}$ represents a gate-emitter voltage.

In this embodiment, it is preferable that the current carrying ability (collector current Ic) of the cell structure in central portion CR is lower by 15% or more than that in the outer peripheral portion.

This embodiment employs one or a combination of the following structures (1)-(4) for changing the current carrying abilities of the respective cell structures in central portion CR and outer peripheral portion PR.

(1) The cell structure in central portion CR has a larger threshold voltage $V_{TH}$ than that in outer peripheral portion PR. More specifically, referring to FIG. 6, a p-type impurity concentration (i.e., a so-called degree of channel doping) of a region where a channel of p-type base region 5 is formed is higher in the cell structure of central portion CR than that in outer peripheral portion PR.

(2) The cell structure in central portion CR has a smaller channel width W than the cell structure in outer peripheral portion PR. Referring to FIG. 5, channel width W is a size in the channel width direction of n$^+$ emitter region 6 at the main surface of semiconductor substrate 1. Thus, referring to FIG. 5, size W in the channel width direction of n$^+$ emitter region 6 is smaller in the cell structure of outer peripheral portion PR than that of central portion CR.

(3) Referring to FIG. 6, the cell structure in central portion CR has a larger channel length L than that in outer peripheral portion PR. Channel length L can be changed by changing a diffusion depth(s) of one or both of p-type base region 5 and n$^+$ emitter region 6.

When the diffusion depth of n$^+$ emitter region 6 of each cell structure in central portion CR is equal to that in outer peripheral portion PR, the diffusion depth of p-type base region 5 may be set larger in the cell structure of outer peripheral portion PR than that of outer peripheral portion PR so that channel length L can be larger in the cell structure of central portion CR than that of outer peripheral portion PR.

When the diffusion depth of p-type base region 5 is uniform in the cell structures of central portion CR and outer peripheral portion PR, the diffusion depth of n$^+$ emitter region 6 may be set smaller in the cell structure of outer peripheral portion PR than that of central portion CR so that channel length L of the cell structure in central portion CR can be larger than that in outer peripheral portion PR.

(4) n$^+$ emitter region 6 of the cell structure in central portion CR has a larger diffusion resistance than that in outer peripheral portion PR. The diffusion resistance of n$^+$ emitter region 6 can be changed by changing the n-type impurity concentration of n$^+$ emitter region 6. More specifically, the n-type impurity concentration of n$^+$ emitter region 6 is lower in the cell structure of central portion CR than that in outer peripheral portion PR.

In this embodiment, it is preferable that a pitch of arrangement of the unit cells in central portion CR is equal to that in outer peripheral portion PR.

An operation and effect of the power semiconductor device of the embodiment will be described below.

Since a guard ring region that is not an active region is present near outer peripheral portion PR, the cell structures in outer peripheral portion PR can effectively diffuse a heat and has a good thermal resistance. Conversely, the cell structures in central portion CR are surrounded by other cell structures in the active region so that thermal interference occurs between these different types of cell structures.

Therefore, assuming, e.g., that all the cell structures in the cell region have substantially the same current carrying ability, the temperature in central portion CR of the cell region becomes higher than that in outer peripheral portion PR when a current flows through the power device. Consequently, a temperature Tj rises in a region where the emitter pad in central portion CR is joined to the emitter wire, and therefore ΔTj increases so that the power cycle life cannot be improved without difficulty.

However, according to the embodiment, the cell structure in central portion CR has a lower current carrying ability than that in outer peripheral portion PR. Therefore, a heating value in the cell structure of central portion CR can be smaller than that in the outer peripheral portion. Thereby, joint temperature Tj can be uniform in central portion CR and outer peripheral portion PR, and maximum joint temperature Tj$_{max}$ in the chip can be low. Accordingly, ΔTj can be small and the power cycle life can be improved.

The inventors have determined a temperature distribution that is exhibited in the cell region when a power is supplied to an IGBT chip having substantially the same current carrying ability in all cell structures thereof.

Figure 8A:
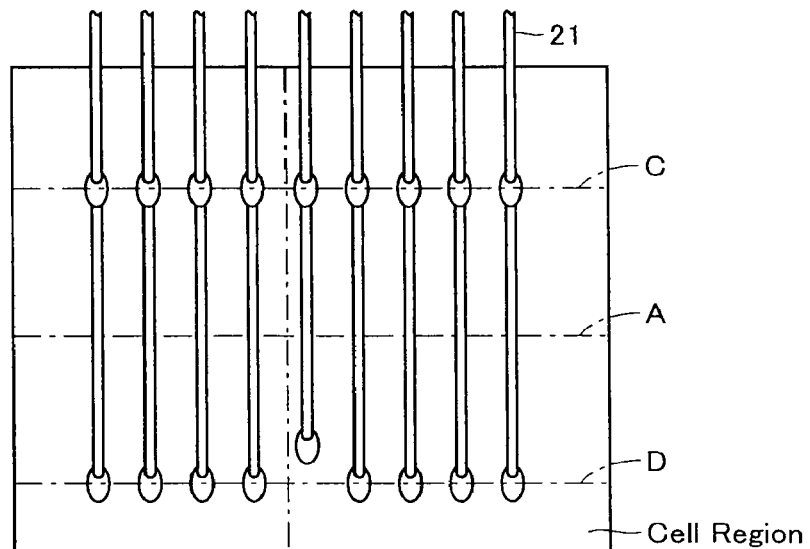
FIG. 8A shows a state of joining between the cell region and emitter wires in the IGBT chip at a time of temperature measurement.
Figure 8B:
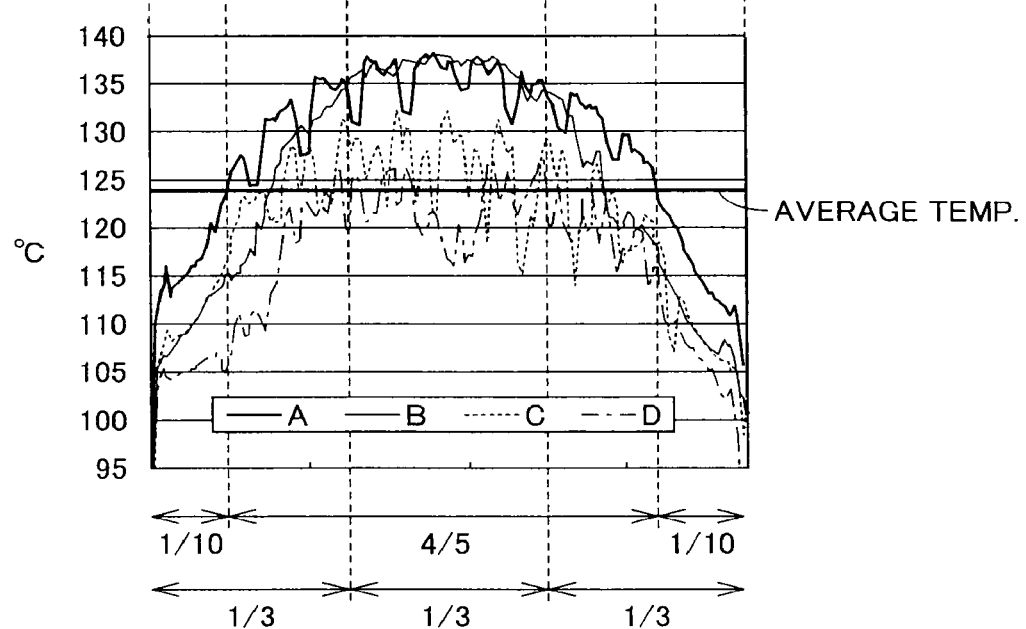
FIG. 8B shows temperature distributions of various portions of the cell region.

For measuring the temperature distribution in the cell region, as shown in FIG. 8A, emitter wires 21 were connected to a plurality of portions in the cell region of the IGBT chip, and the IGBT chip is energized. The IGBT chip shown in FIG. 8A has a guard ring region around its cell region, but the guard ring region is not shown in the figure. FIG. 8B shows results obtained by energizing the IGBT chip, and particularly shows the temperature distributions in portions taken along imaginary lines A-D in the cell region, respectively.

It can be seen from FIG. 8B that each of the temperature distributions in the respective portions taken along imaginary lines A-D is high in the center of the cell region, and is low in the peripheral areas. It can be seen that the temperature distribution obtained along imaginary line A extending through the center of the cell region exhibits the highest temperature. Also, it can be seen that the temperature distribution obtained along imaginary line A and exhibiting the highest temperature exhibits, in four-fifths of the cell region, the temperature higher than the average temperature obtained from the temperature distributions along imaginary lines A-D. Accordingly, when it is intended to uniformize the temperature distributions in the cell region based the above average temperature, it is preferable to lower the current carrying ability of the cell structure in central portion CR and to raise the current carrying ability of the cell structure in outer peripheral portion PR, in which case one-tenth in size of the cell region measured from its outer periphery is used as outer peripheral portion PR as shown in FIG. 7, and a remaining region, i.e., four-fifths of the cell region is used as central portion CR. This can lower the temperature in central portion CR toward the average temperature, and can raise the temperature in outer peripheral portion PR toward the average temperature so that the temperature in the cell region can be uniformized.

In this embodiment, it is preferable that the arrangement pitch of the unit cells in central portion CR is equal to that in outer peripheral portion PR (i.e., the arrangement pitch in p-type base region is constant). This will be described below.

FIG. 9A is a schematic cross section showing a structure in which the unit cells in central portion CR and outer peripheral portion PR are arranged at the same pitch. FIG. 9B is a schematic cross section showing a structure in which the arrangement pitch of unit cells in central portion CR is different from that in outer peripheral portion PR. As shown in FIG. 9B, when the arrangement pitch of the unit cells in central portion CR is larger than that in outer peripheral portion PR, a space SP2 between p-type base regions 5 in central portion CR increases. When the IGBT holds a breakdown voltage, a depletion layer 19 extends from a pn junction between p-type base region 5 and n⁻ epitaxial region 4. When space SP2 increases, a pair of depletion layers 19 that extend from the opposite sides of space SP2, respectively, cannot join together without difficulty. Therefore, the IGBT cannot hold a sufficient breakdown voltage, and the breakdown voltage may lower.

Conversely, when the unit cells in central portion CR and outer peripheral portion PR are arranged in the same arrangement pitch as shown in FIG. 9A, a space SP1 between p-type base regions 5 in central portion CR is equal to space SP1 in outer peripheral portion PR. Thus, the arrangement pitch in p-type base region 5 is uniform in central portion CR and outer peripheral portion PR. Therefore, when the IGBT holds the breakdown voltage, a pair of depletion layers 19 extending from the opposite sides of space SP1, respectively, can join together without difficulty even in central portion CR. Therefore, the IGBT can sufficiently hold the breakdown voltage.

Second Embodiment

Figure 10:
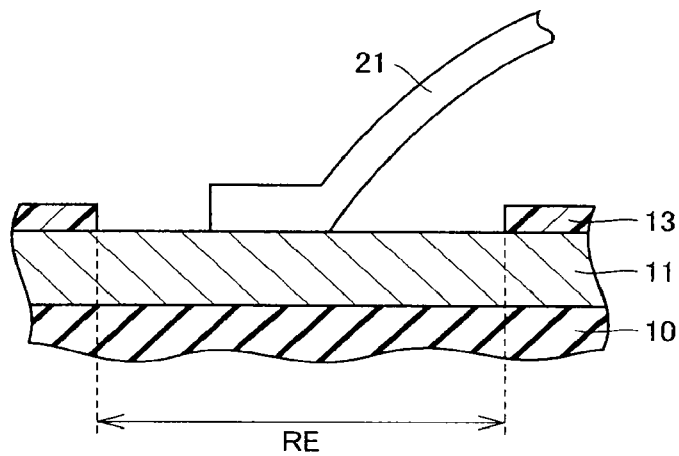
FIG. 10 is a fragmentary cross section schematically showing a structure of a power semiconductor device according to a second embodiment of the invention, and corresponds to a cross section taken along line X-X in FIG. 3.

This embodiment differs from the structure of the first embodiment in subject or target of which current carrying ability is to be changed. More specifically, referring to FIG. 10, the second embodiment is configured such that the cell structure located immediately under the joining portion of emitter wire 21 has a lower current carrying ability than other cell structures not located immediately under the joining portion of emitter wire 21.

The joining portion of emitter wire 21 represents a whole region RE of emitter pad 11 that is exposed through the opening in a passivation film 13. In this embodiment, the cell structure located immediately under exposed region RE of emitter pad 11 has a lower current carrying ability than the cell structures that are not located immediately under exposed region RE of emitter pad 11.

For changing the current carrying ability, the embodiment employs one of the structures in items (1)-(4) already described in connection with the first embodiment, or employs an arbitrary combination of these structures.

In this embodiment, it is likewise preferable that the arrangement pitch of the cell structures in central portion CR is equal to that in outer peripheral portion PR.

Structures of this embodiment other than the above are substantially the same as those of the first embodiment described before. Therefore, the same elements bear the same reference numbers, and description thereof is not repeated.

An operation and effect of the power semiconductor device of this embodiment will be described below.

A current is concentrated into the joining portion between emitter pad 11 and emitter wire 21 of the IGBT chip. Thereby, the temperature of the joining portion of emitter wire 21 becomes higher than those of the other regions. When the temperature of the IGBT unit cell rises, the threshold voltage and the like of the unit cell lower to increase the current carrying ability so that the temperature of the joining portion of emitter wire 21 further rises. Thereby, ΔTj rises and this may lower the power cycle life.

According to the structure of this embodiment, however, the cell structure located immediately under the joining portion of emitter wire 21 has the lower current carrying ability than the other cell structures not located immediately under the joining portion of emitter wire 21. Therefore, the heating value in the joining portion between emitter pad 11 and emitter wire 21 can be small. Thereby, ΔTj can be small, and the power cycle life can be improved.

Third Embodiment

Figure 11:
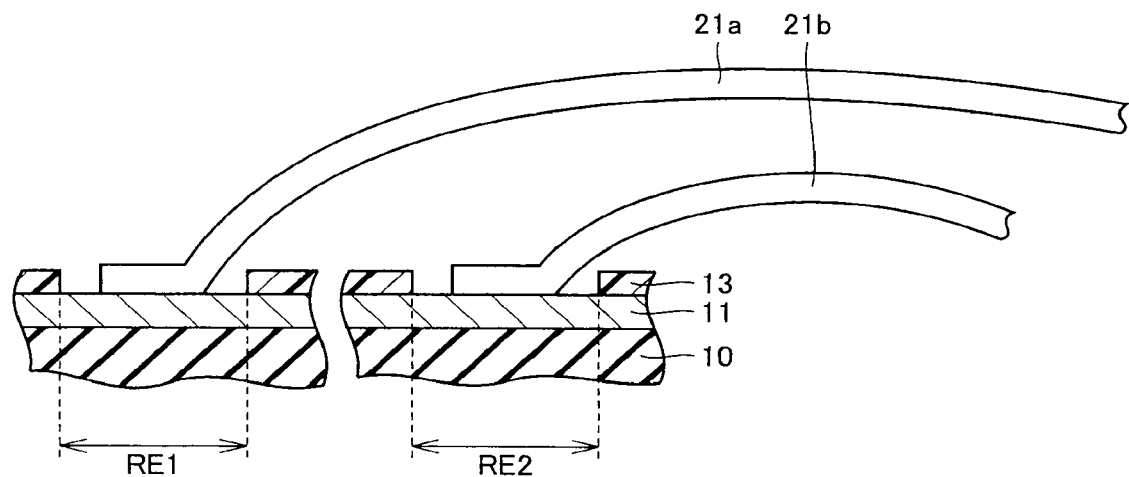
FIG. 11 is a fragmentary cross section schematically showing a structure of a power semiconductor device according to a third embodiment of the invention.

This embodiment differs from the structure of the first embodiment in subject of which current carrying ability is to be changed. More specifically, referring to FIG. 11, the third embodiment is configured such that the cell structure located immediately under the joint portion of one of emitter wires 21 has the current carrying ability different from that of the cell structure located immediately under the joining portion of the other emitter wire 21.

The joining portion of emitter wire 21 represents a whole area of a region RE1 or RE2 of emitter pad 11 that is exposed through the opening in passivation film 13, similarly to the second embodiment. In the third embodiment, therefore, the cell structure located immediately under exposed region RE1 of emitter pad 11 has a current carrying ability different from that of the cell structure that is located immediately under exposed region RE2 of emitter pad 11. More specifically, the cell structure located immediately under exposed region RE1 of emitter pad 11 connected to an emitter wire 21a of a long interconnection length has a lower current carrying ability than the cell structure that is located immediately under exposed region RE2 of emitter pad 11 connected to an emitter wire 21b of a short interconnection length.

For changing the current carrying ability, this embodiment employs one of the structures in items (1)-(4) already described in connection with the first embodiment, or employs an arbitrary combination of these structures.

In this embodiment, it is likewise preferable that the arrangement pitch of the unit cells in central portion CR is equal to that in outer peripheral portion PR.

Figure 15:
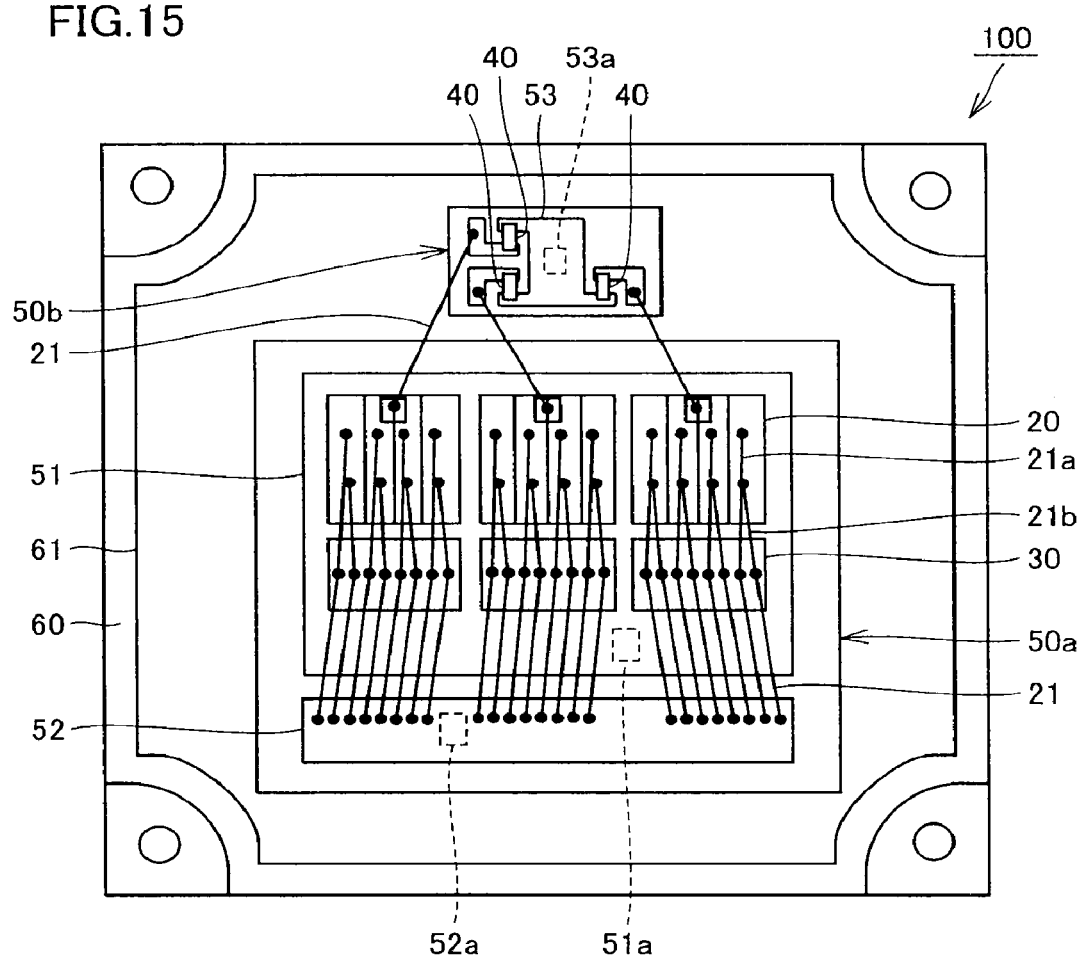
FIG. 15 is a schematic plan showing a schematic structure of a module forming a power semiconductor device according to a third embodiment of the invention.

FIG. 15 shows an example of a structure of a semiconductor device having emitter wire 21a of the long interconnection length and emitter wire 21b of the short interconnection length. Referring to FIG. 15, the emitter electrodes of IGBT 20 are electrically connected to the anode electrodes of diode 30 by wires (i.e., so-called bonding wires) 21a and 21b having different lengths, respectively. A casing 61 is arranged around a region where power devices 20, reflux diodes 30 and resistance elements 40 are arranged.

Structures of this embodiment other than the above are substantially the same as those of the first embodiment described before. Therefore, the same elements bear the same reference numbers, and description thereof is not repeated.

An operation and effect of the power semiconductor device of this embodiment will be described below.

In the structure where the plurality of emitter wires 21 having different interconnection lengths, respectively, are connected to the IGBT chip, when a large current flows through emitter wire 21 of the long interconnection, emitter wire 21 generates a heat by itself. The heat generated from emitter wire 21 affects temperature Tj of the joining portion between emitter pad 11 and emitter wire 21 so that ΔTj may increase and the power cycle life may lower.

However, this embodiment is configured such that the cell structure located immediately under the joining portion of emitter wire 21 has a current carrying ability different from that of the cell structure located immediately under the joining portion of the other emitter wire 21. Thereby, the cell structure located immediately under the joining portion of emitter wire 21 of the long interconnection length can have a lower current carrying ability than that located immediately under the joining portion of emitter wire 21 of the short interconnection length. Therefore, it is possible to reduce the heating value at the connection of emitter wire 21 of the long interconnection length. Accordingly, ΔTj can be small, and the power cycle life can be improved.

The foregoing first to third embodiments may be appropriately combined together.

In the foregoing first to third embodiments, the IGBT of the planar gate type has been described as the vertical power device. However, the invention is not restricted to this, and can be applied to an IGBT of a trench gate type shown in FIG. 12, a power MISFET (Metal Insulator Semiconductor Field Effect Transistor) of a planar gate type shown in FIG. 13, a power MISFET of a trench gate type shown in FIG. 14, a diode and the like.

Figure 12:
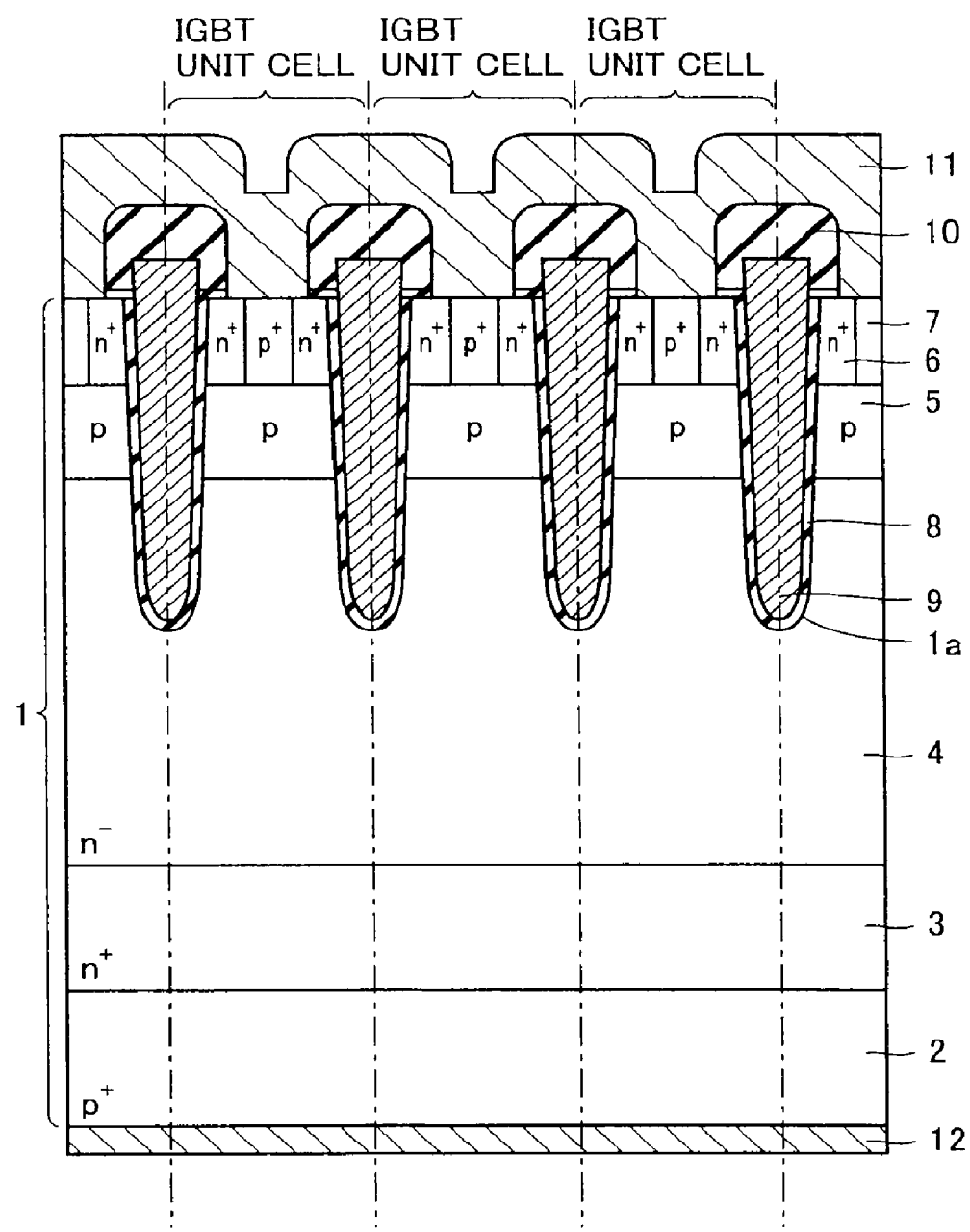
FIG. 12 is a schematic cross section showing a structure of an IGBT of a trench gate type.

The structure of the IGBT of the trench gate type shown in FIG. 12 is different from the IGBT of the planar gate type shown in FIG. 6 in that gate electrode layer 9 fills a trench 1a formed at the main surface of semiconductor substrate 1 with gate insulating film 8 interposed therebetween. n⁻ epitaxial region 4, p-type base region 5 and n⁺ emitter region 6 are successively layered along a side wall of gate electrode layer 9. p⁺ region 7 connected to p-type base region 5 is formed at the main surface of semiconductor substrate 1 and is located between n⁺ emitter regions 6.

Structures in FIG. 12 other than the above are substantially the same as those shown in FIG. 6. Therefore, the same elements bear the same reference numbers, and description thereof is not repeated.

Figure 13:
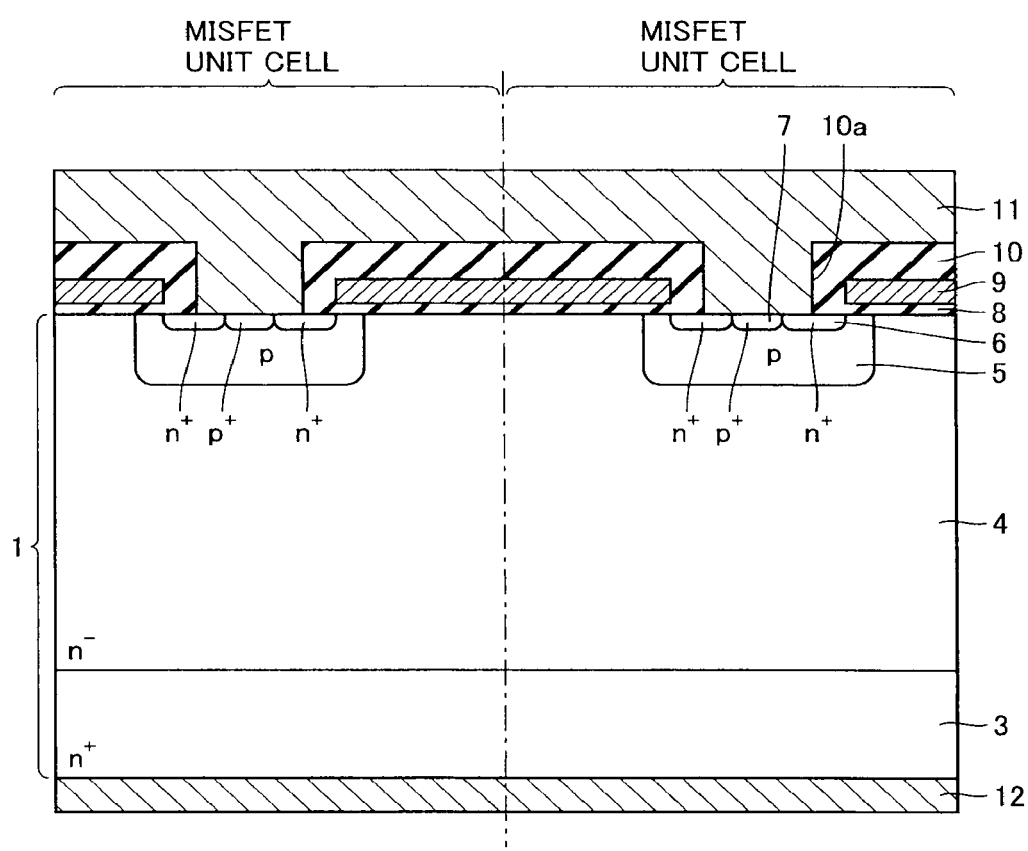
FIG. 13 is a schematic cross section showing a structure of a power MISFET of a planar gate type.

The structure of the power MISFET of the planar gate type shown in FIG. 13 differs from the IGBT of the planar gate type shown in FIG. 6 in that p⁺ collector region 2 is eliminated and n⁺ epitaxial region 3 is connected to drain electrode 12.

This power MISFET may be a power MOSFET (Metal Oxide Semiconductor Field Effect Transistor) having gate insulating film 8 made of a silicon oxide film.

Structures in FIG. 13 other than the above are substantially the same as those shown in FIG. 6. Therefore, the same components bear the same reference numbers, and description thereof is not repeated.

Figure 14:
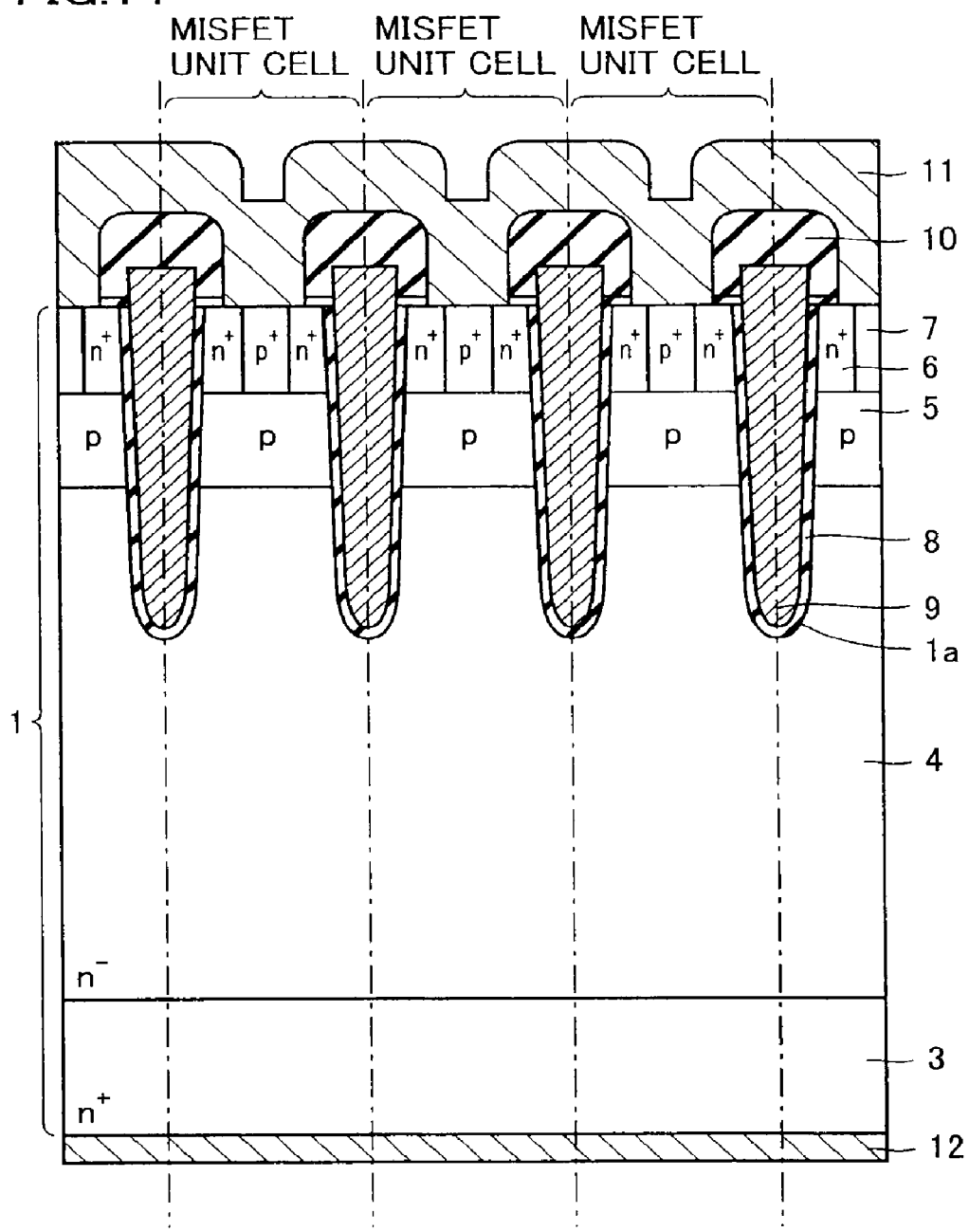
FIG. 14 is a schematic cross section showing a structure of a power MISFET of a trench gate type.

The structure of the power MISFET of the trench gate type shown in FIG. 14 differs from the IGBT of the planar gate type shown in FIG. 12 in that p⁺ collector region 2 is eliminated, and n⁺ epitaxial region 3 is connected to drain electrode 12. This power MISFET may be a power MOSFET having gate insulating film 8 made of a silicon oxide film.

Structures in FIG. 14 other than the above are substantially the same as those shown in FIG. 12. Therefore, the same components bear the same reference numbers, and description thereof is not repeated.

For example, the following four structures can be envisaged as the specific structure of the memory cell (IGBT or power MOSFET) to which the foregoing first to third embodiments can be applied.

Figure 16:
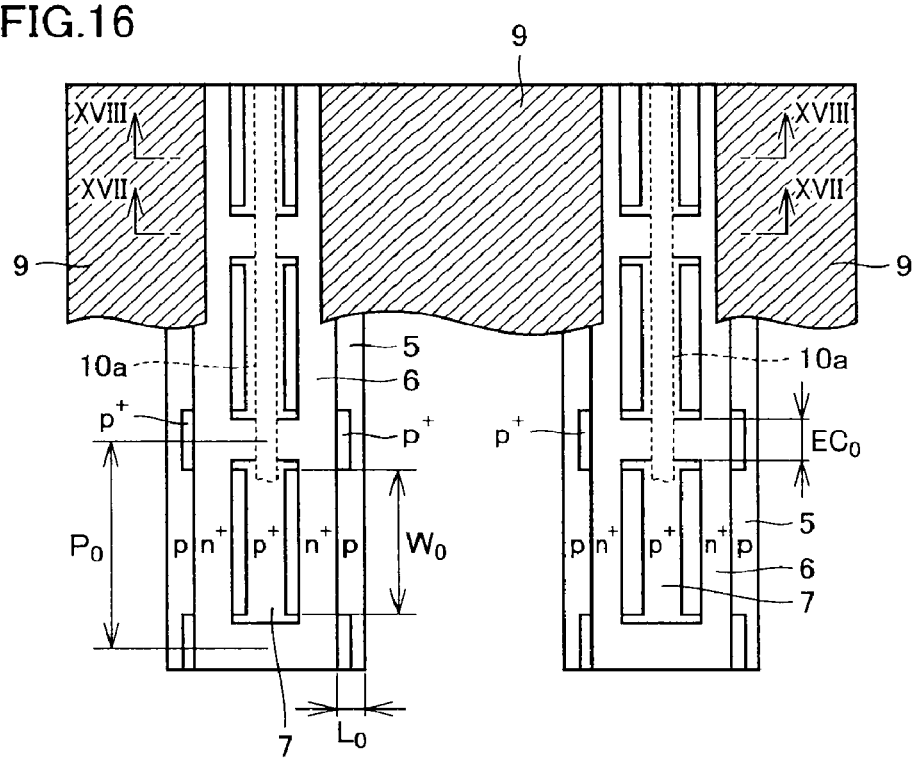
FIG. 16 is a schematic plan showing a first structure of a memory cell (IGBT or power MOSFET) of a planar gate type that can employ the structures of the first to third embodiments.
Figure 17:
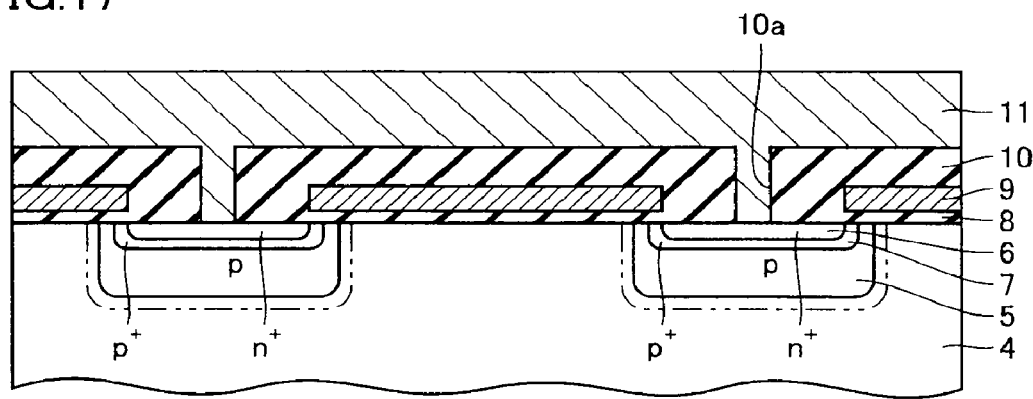
FIG. 17 is a schematic cross section taken along line XVII-XVII in FIG. 16.
Figure 18:
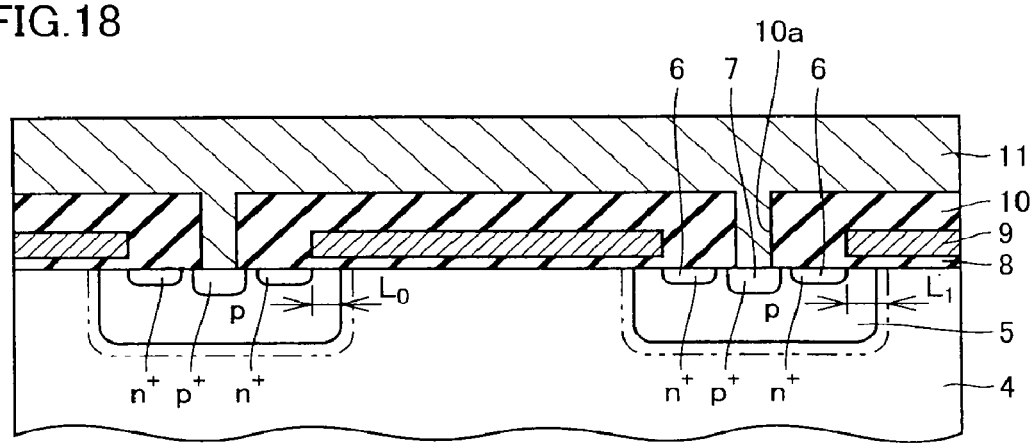
FIG. 18 is a schematic cross section taken along line XVIII-XVIII in FIG. 16.
Figure 19:
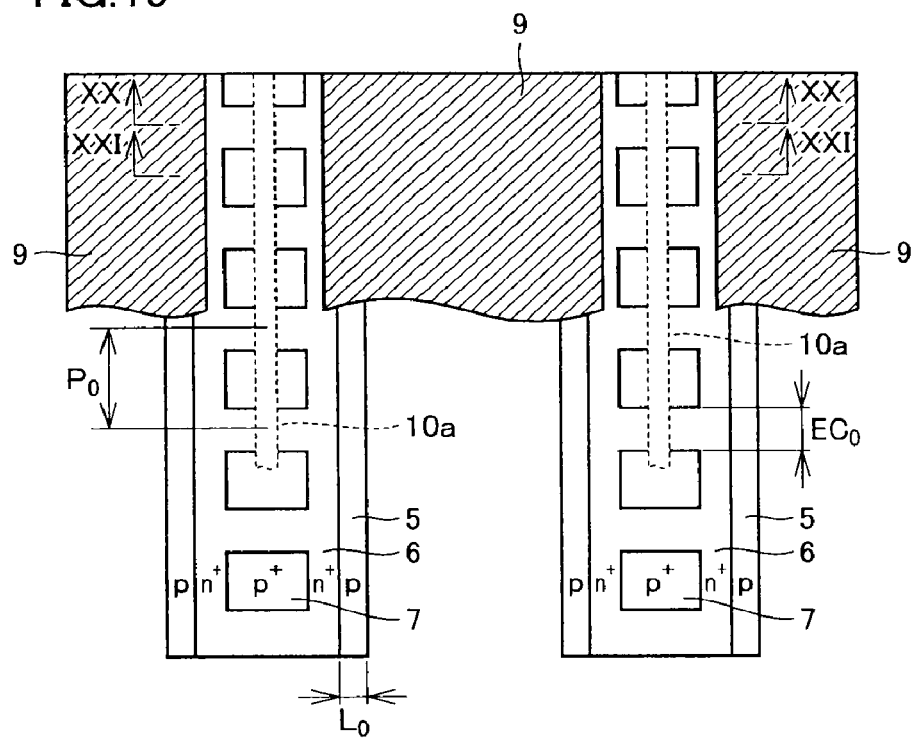
FIG. 19 is a schematic plan showing a second structure of a memory cell (IGBT or power MOSFET) of the planar gate type that can employ the structures of the first to third embodiments.
Figure 20:
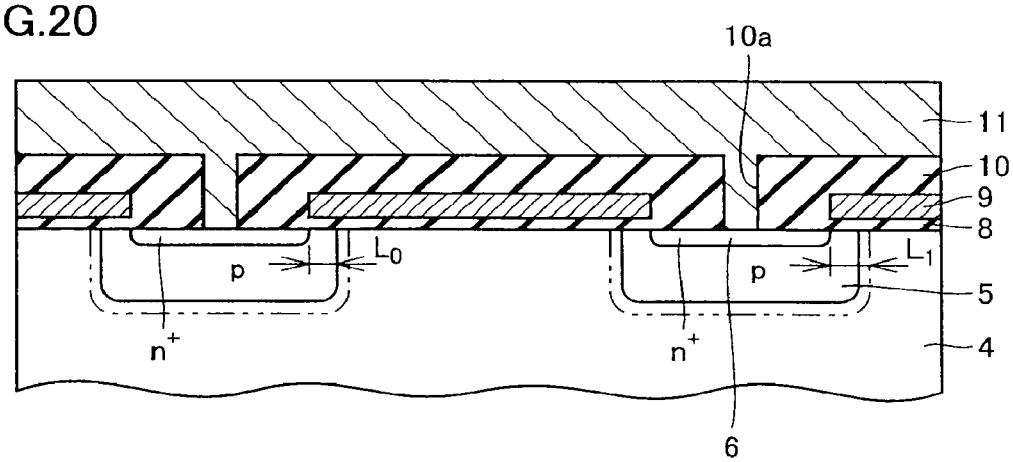
FIG. 20 is a schematic cross section taken along line XX-XX in FIG. 19.
Figure 21:
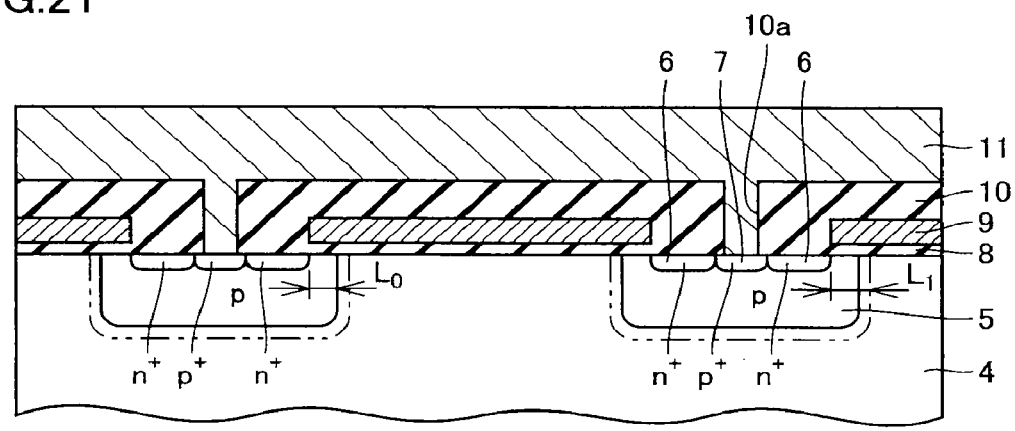
FIG. 21 is a schematic cross section taken along line XXI-XXI in FIG. 19.
Figure 22:
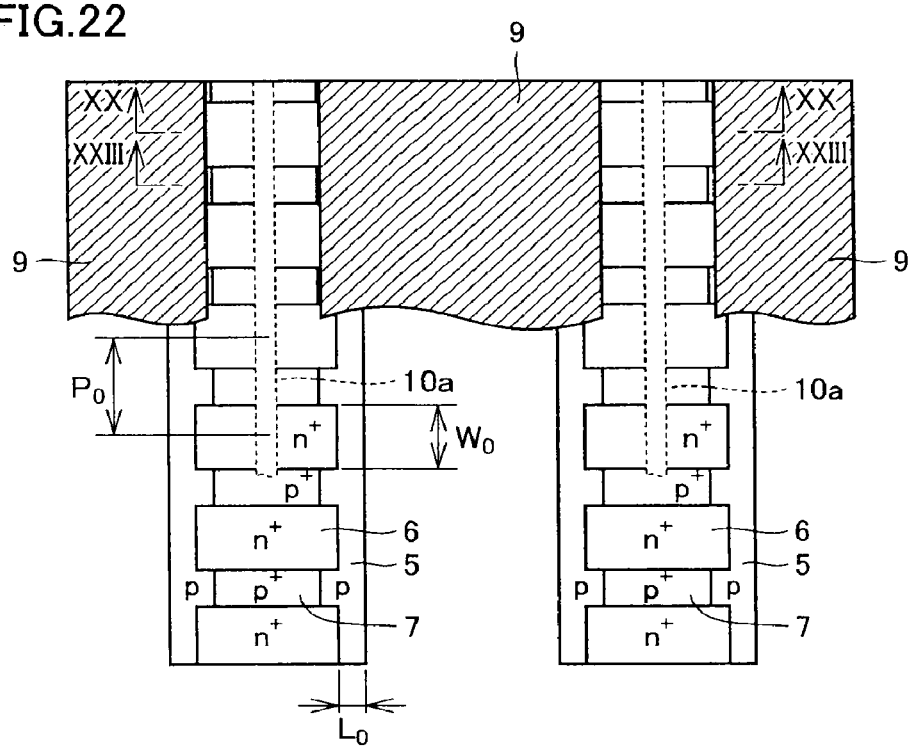
FIG. 22 is a schematic plan showing a third structure of a memory cell (IGBT or power MOSFET) of the planar gate type that can employ the structures of the first to third embodiments.
Figure 23:
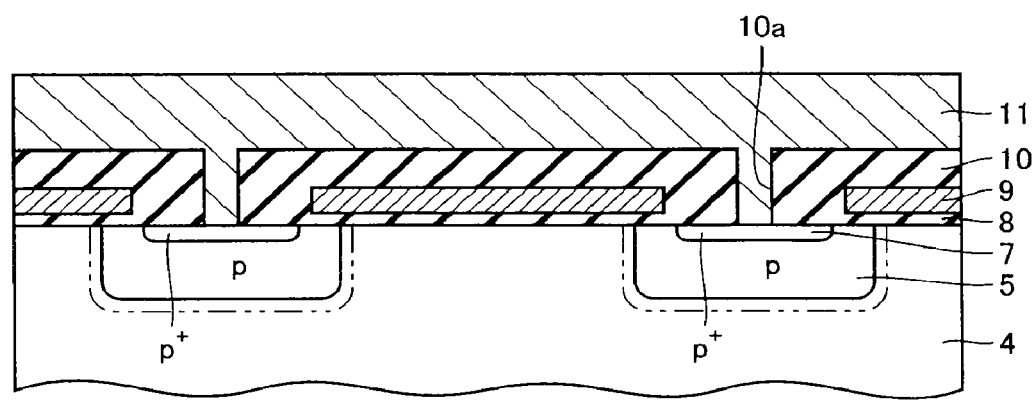
FIG. 23 is a schematic cross section taken along line XXIII-XXIII in FIG. 22.
Figure 24:
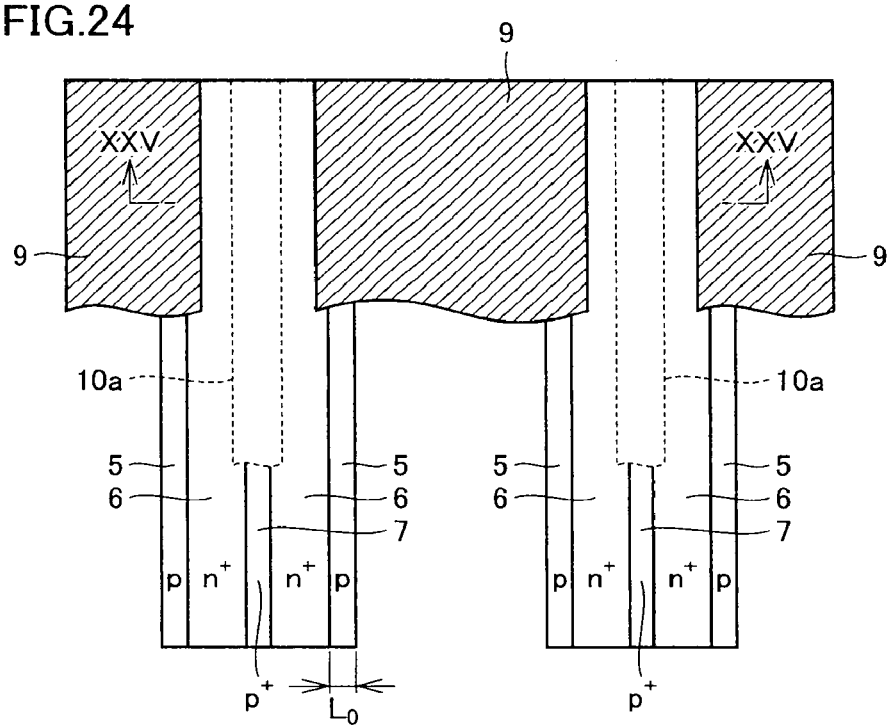
FIG. 24 is a schematic plan showing a fourth structure of a memory cell (IGBT or power MOSFET) of the planar gate type that can employ the structures of the first to third embodiments.
Figure 25:
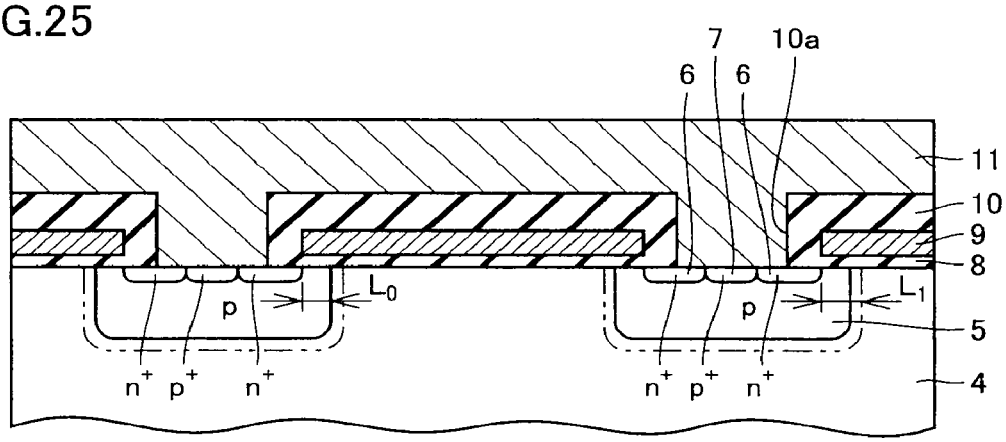
FIG. 25 is a schematic cross section taken along line XXV-XXV in FIG. 24.

FIGS. 16-18 shows the first structure, FIGS. 19-21 show the second structure, FIGS. 22 and 23 show the third structure, and FIGS. 24 and 25 show the fourth structure.

The first structure is shown in FIG. 16, which is a schematic plan showing the structure of the memory cell of the planar gate type in the first structure. FIGS. 17 and 18 are schematic cross sections taken along lines XVII-XVII and XVIII-XVIII in FIG. 16, respectively.

Referring to FIGS. 16-18, n⁺ emitter region 6 extending in a ladder-like form in a plan view is formed at the main surface of semiconductor substrate 1 and particularly in a region where p-type base region 5 is formed. In the plan view, p⁺ region 7 continuously extends through a central portion of the ladder defined by n⁺ emitter region 6 in the same direction as this ladder. p⁺ region 7 is formed deeper than n⁺ emitter region 6 with respect to the main surface of semiconductor substrate 1.

Gate electrode layer 9 is formed on the main surface of semiconductor substrate 1, and is opposed through gate insulating film 8 to p-type base region 5 located between n⁻ epitaxial region 4 and n⁺ emitter region 6. Gate electrode layer 9 is also formed on n⁻ epitaxial region 4 located between neighboring p-type base regions 5 with gate insulating film 8 interposed therebetween.

Insulating film 10 is provided with contact holes 10a each reaching a surface of the rung of the ladder of n⁺ emitter region 6 and a surface of p⁺ region 7. Thereby, emitter pad 11 is electrically connected to n⁺ emitter region 6 and p⁺ region 7 through contact hole 10a.

For the sake of illustration, FIG. 16 does not show a part of contact holes 10a. This first structure is substantially the same as that on the emitter side of the IGBT shown in FIGS. 5 and 6.

The second structure is shown in FIG. 19, which is a schematic plan showing the structure of the memory cell of the planar gate type. FIGS. 20 and 21 are schematic cross sections taken along lines XX-XX and XXI-XXI in FIG. 19, respectively. Referring to FIGS. 19-21, the second structure differs from the foregoing first structure in that p⁺ region 7 having an island form is formed at the main surface of semiconductor substrate 1 and particularly is surrounded by two frames and two rungs of the ladder defined by n⁺ emitter region 6, and that n⁻ emitter region 6 and p⁺ region 7 have substantially the same depth.

Structures other than the above are substantially the same as those of the first structure. Therefore, the same components bear the same reference numbers, and description thereof is not repeated.

FIG. 19 does not show a part of contact holes 10*a* for the sake of illustration.

The third structure is shown in FIG. 22, which is a schematic plan showing the structure of the memory cell of the planar gate type. FIG. 23 is a schematic cross section taken along line XXIII-XXIII in FIG. 22. The sectional structure along line XX-XX in FIG. 22 corresponds to that in FIG. 20.

Referring to FIGS. 20, 22 and 23, the third structure differs from the foregoing first structure in that $n^+$ emitter regions 6 and $p^+$ regions 7 are arranged alternately to each other at the main surface of semiconductor substrate 1 and particularly within the region where p-type base region 5 is formed, and that $n^+$ emitter region 6 and $p^+$ region 7 have substantially the same depth.

Structures other than the above are substantially the same as those of the first structure. Therefore, the same components bear the same reference numbers, and description thereof is not repeated.

FIG. 22 does not show a part of contact holes 10*a* for the sake of illustration.

The fourth structure is shown in FIG. 24, which is a schematic plan showing the structure of the memory cell of the planar gate type. FIG. 25 is a schematic cross section taken along line XXV-XXV in FIG. 24. Referring to FIGS. 24 and 25, the fourth structure differs from the foregoing first structure in that $n^+$ emitter region 6 and $p^+$ region 7 are arranged parallel to each other at the main surface of semiconductor substrate 1 and particularly within the region where p-type base region 5 is formed, and that $n^+$ emitter region 6 and $p^+$ region 7 have substantially the same depth.

Structures other than the above are substantially the same as those of the first structure. Therefore, the same components bear the same reference numbers, and description thereof is not repeated.

FIG. 22 does not show a part of contact holes 10*a* for the sake of illustration.

In FIGS. 16, 19, 22 and 24 showing the respective structures, a size $W_0$ represents a channel width, and a size $L_0$ represents a channel length. A size $P_0$ represents a contact pitch of $n^+$ emitter regions 6 and emitter pads 11, and a size $EC_0$ represents a connection length of $n^+$ emitter region 6 and contact hole 10*a*.

Figure 26:
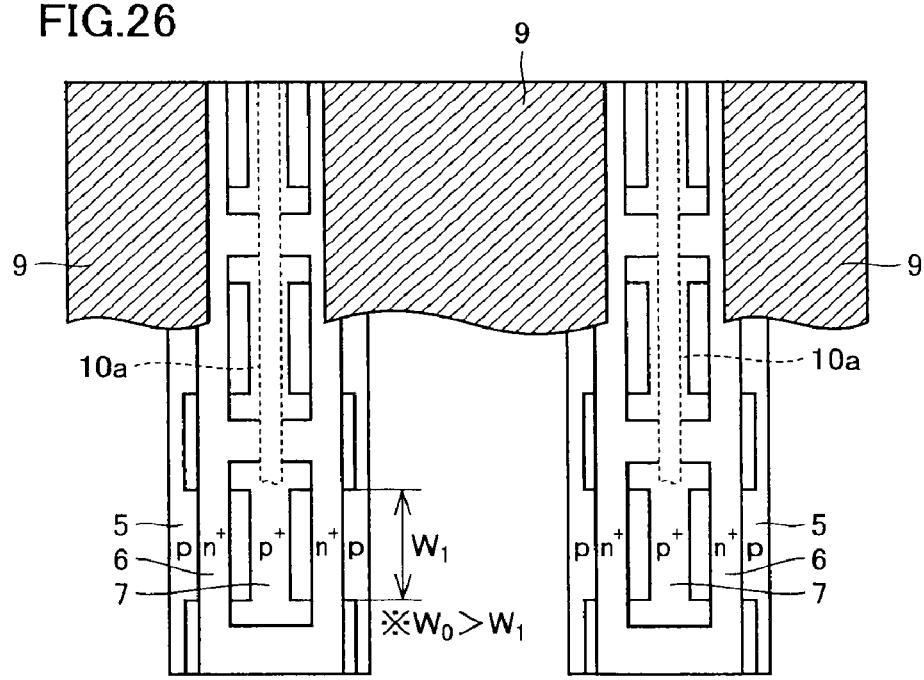
FIG. 26 is a schematic plan showing a structure having a channel width of $W_1$ shorter than $W_0$ of the structure of FIG. 16.
Figure 27:
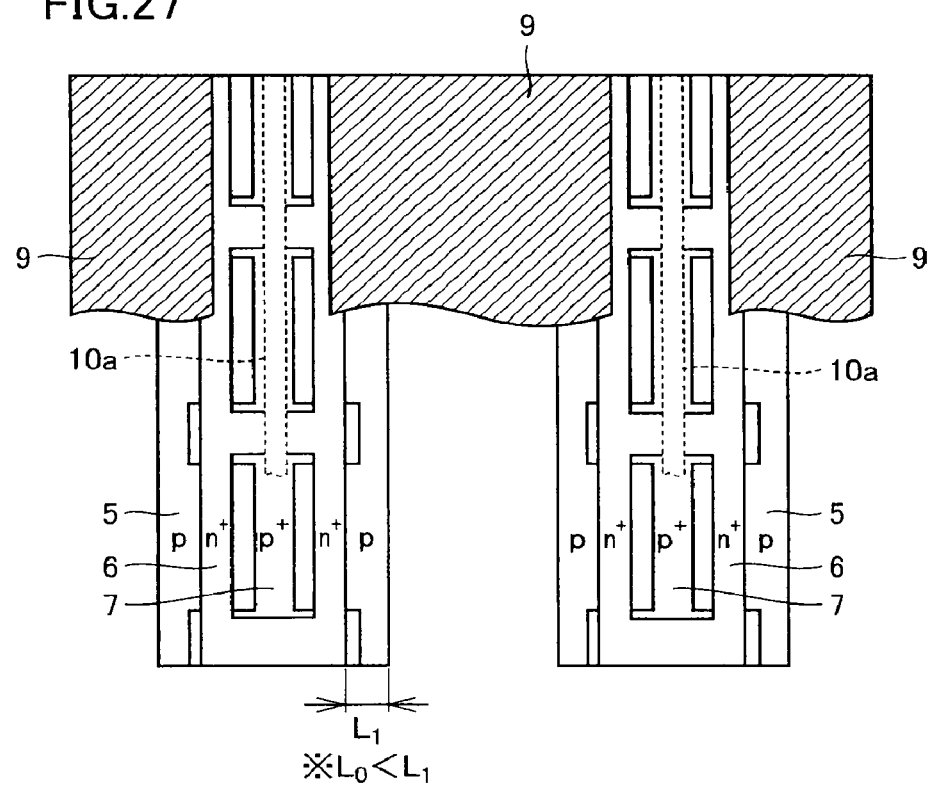
FIG. 27 is a schematic plan showing a structure having a channel length of $L_1$ longer than $L_0$ of the structure of FIG. 16.

In the first structure shown in FIGS. 16-18, the current carrying ability of the cell structure can be changed by changing at least one of the channel dope concentration of p-type base region 5, channel width $W_0$, channel length $L_0$, the concentration of $n^+$ emitter region 6 and contact pitch $P_0$. FIG. 26 shows a structure having a channel width $W_1$ shorter than channel width $W_0$ shown in FIG. 16. FIG. 27 shows a structure having a channel length $L_1$ longer than channel length $L_0$ shown in FIG. 16.

Figure 28:
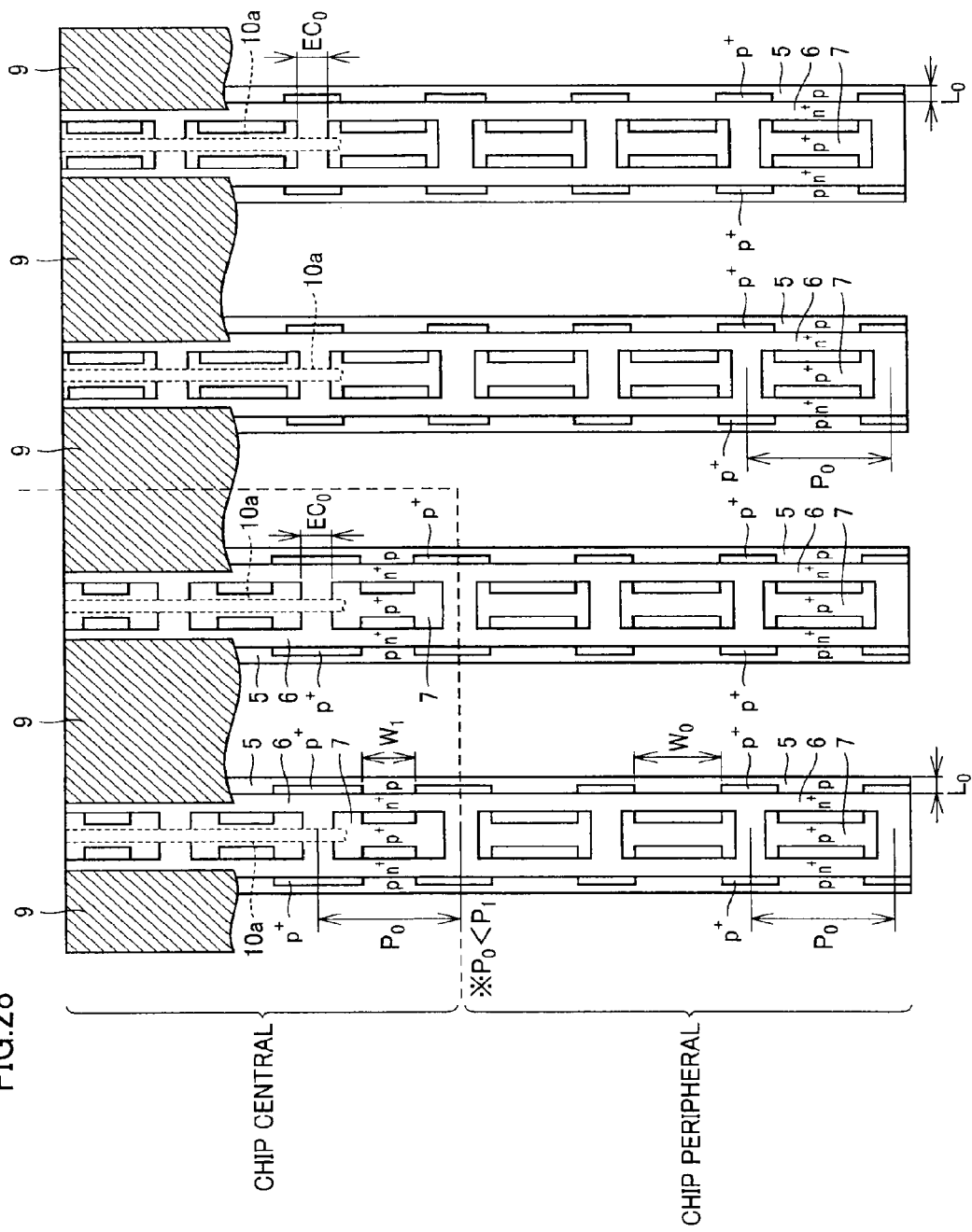
FIG. 28 is a schematic plan showing a planar structure corresponding to the first structure (in FIGS. 16-18) and having a chip of which channel width $W_1$ in its central portion is smaller than channel width $W_0$ in its peripheral portion.

FIG. 28 shows a planar structure that corresponds to the foregoing first structure, and has the chip (cell region) central portion having a channel width $W_1$ smaller than channel width $W_0$ of the chip (cell region) peripheral portion. Thereby, the current carrying ability of the cell structure in the chip central portion can be lower than that in the chip peripheral portion. The structure shown in FIG. 28 has the chip central portion of which channel length $L_0$, contact pitch $P_0$ and connection length $EC_0$ are the same as those in the chip peripheral portion.

Figure 29:
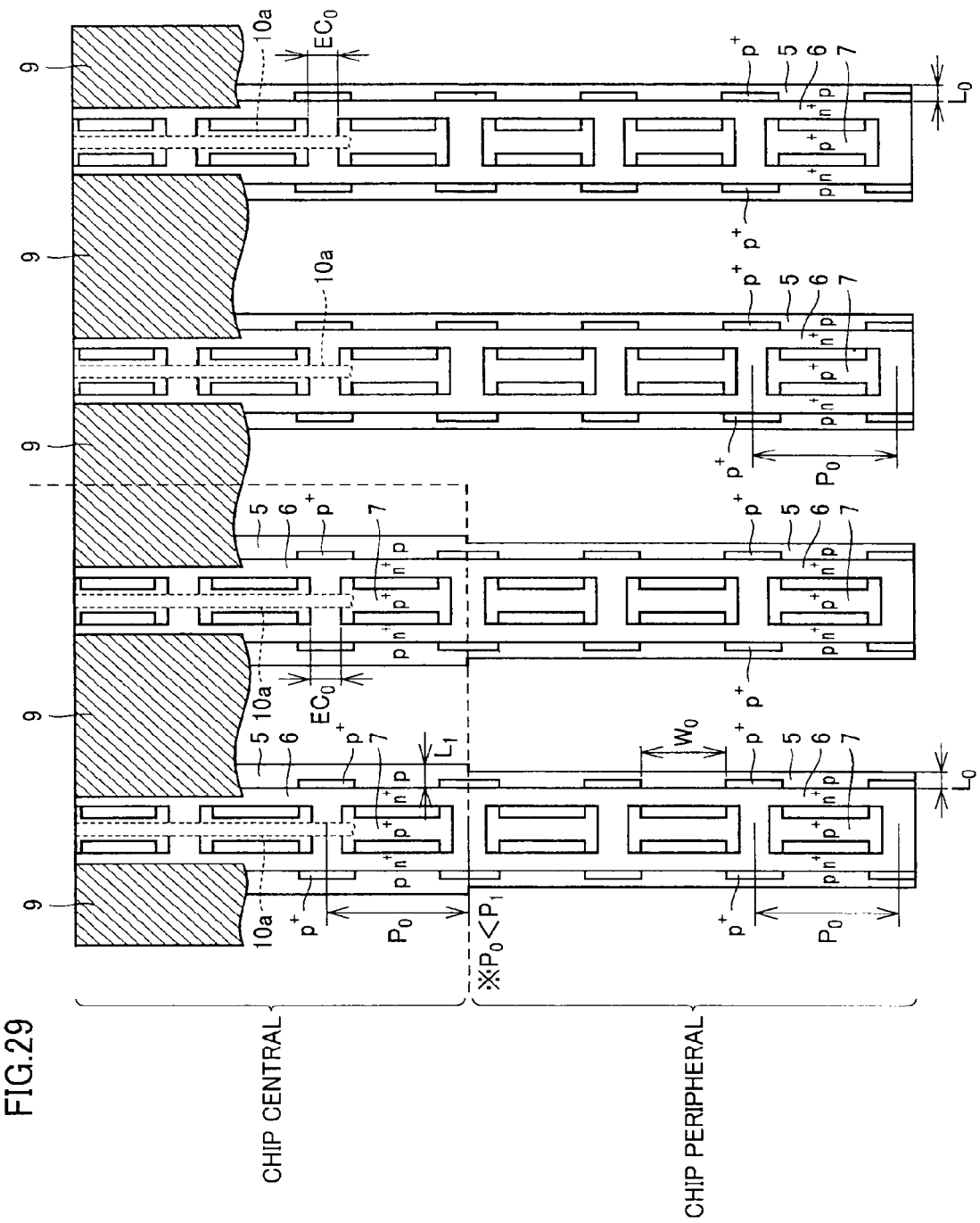
FIG. 29 is a schematic plan showing a planar structure corresponding to the first structure in FIGS. 16 to 18 and having a chip of which channel length $L_1$ in its central portion is larger than channel length $L_0$ in its peripheral portion.

FIG. 29 shows a planar structure that corresponds to the foregoing first structure, and has the chip (cell region) central portion having a channel length $L_1$ larger than channel length $L_0$ of the chip (cell region) peripheral portion. Thereby, the current carrying ability of the cell structure in the chip central portion can be lower than that in the chip peripheral portion. The structure shown in FIG. 29 has the chip central portion of which channel width $W_0$, contact pitch $P_0$ and connection length $EC_0$ are the same as those in the chip peripheral portion.

Figure 30:
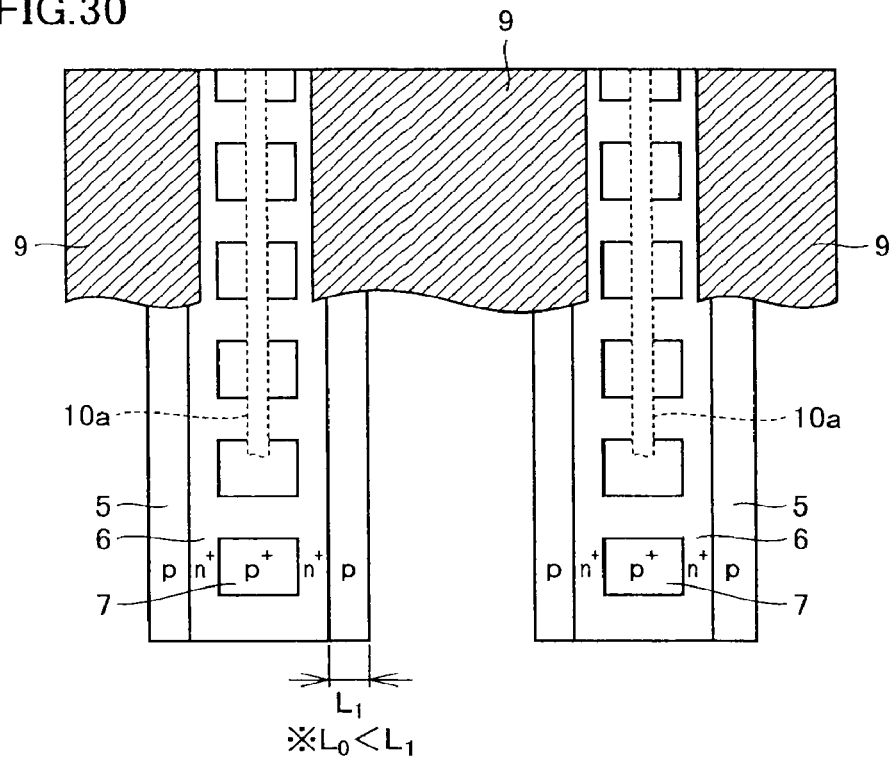
FIG. 30 is a schematic plan showing a structure corresponding to that in FIG. 19 and having a channel length of $L_1$ longer than $L_0$.
Figure 31:
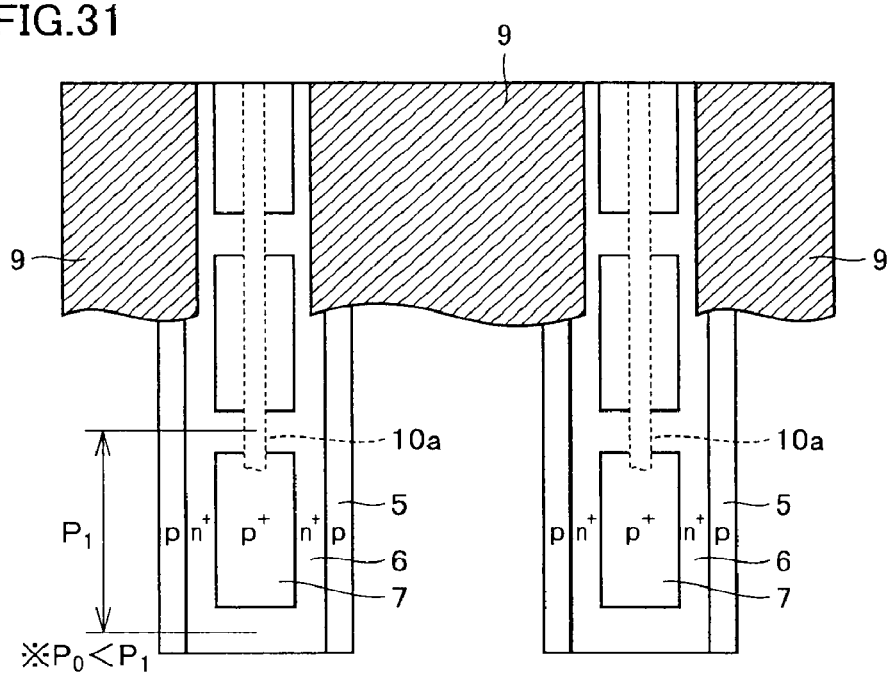
FIG. 31 is a schematic plan showing a structure corresponding to that in FIG. 19 and having a contact pitch $P_1$ larger than $P_0$.

In the second structure shown in FIGS. 19-21, the current carrying ability of the cell structure can be changed by changing at least one of the channel dope concentration of p-type base region 5, channel length $L_0$, the concentration of $n^+$ emitter region 6 and contact pitch $P_0$. FIG. 30 shows a structure having channel length $L_1$ longer than channel length $L_0$ shown in FIG. 19. FIG. 31 shows a structure having a contact pitch $P_1$ longer than contact pitch $P_0$ shown in FIG. 19.

Figure 32:
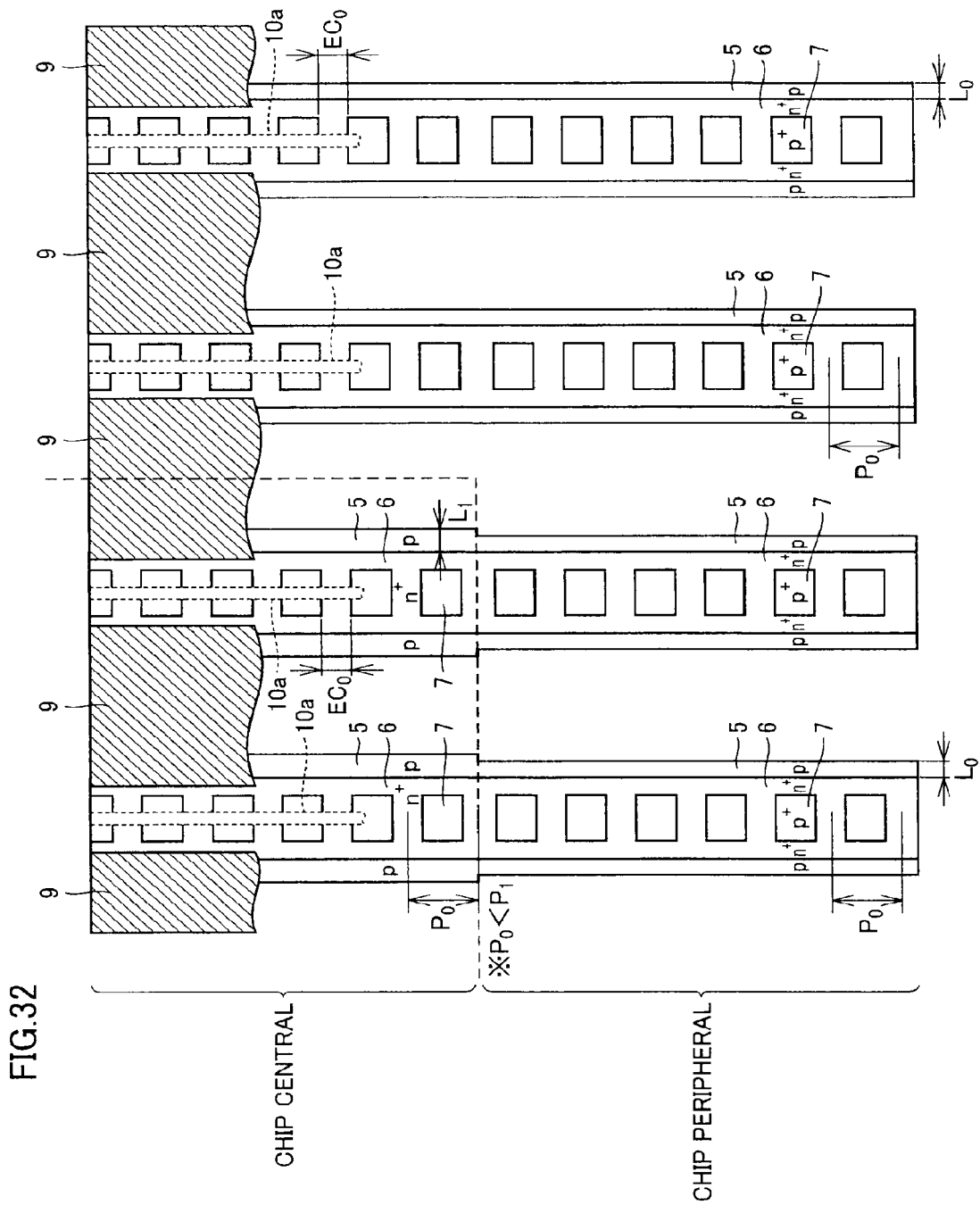
FIG. 32 is a schematic plan showing a planar structure corresponding to the second structure in FIGS. 19 to 21 and having a chip of which channel length $L_1$ in its central portion is larger than channel length $L_0$ in its peripheral portion.

FIG. 32 shows a planar structure that corresponds to the foregoing second structure, and has the chip (cell region) central portion having channel length $L_1$ larger than channel length $L_0$ of the chip (cell region) peripheral portion. Thereby, the current carrying ability of the cell structure in the chip central portion can be lower than that in the chip peripheral portion. The structure shown in FIG. 32 has the chip central portion of which contact pitch $P_0$ and connection length $EC_0$ are the same as those in the chip peripheral portion.

Figure 33:
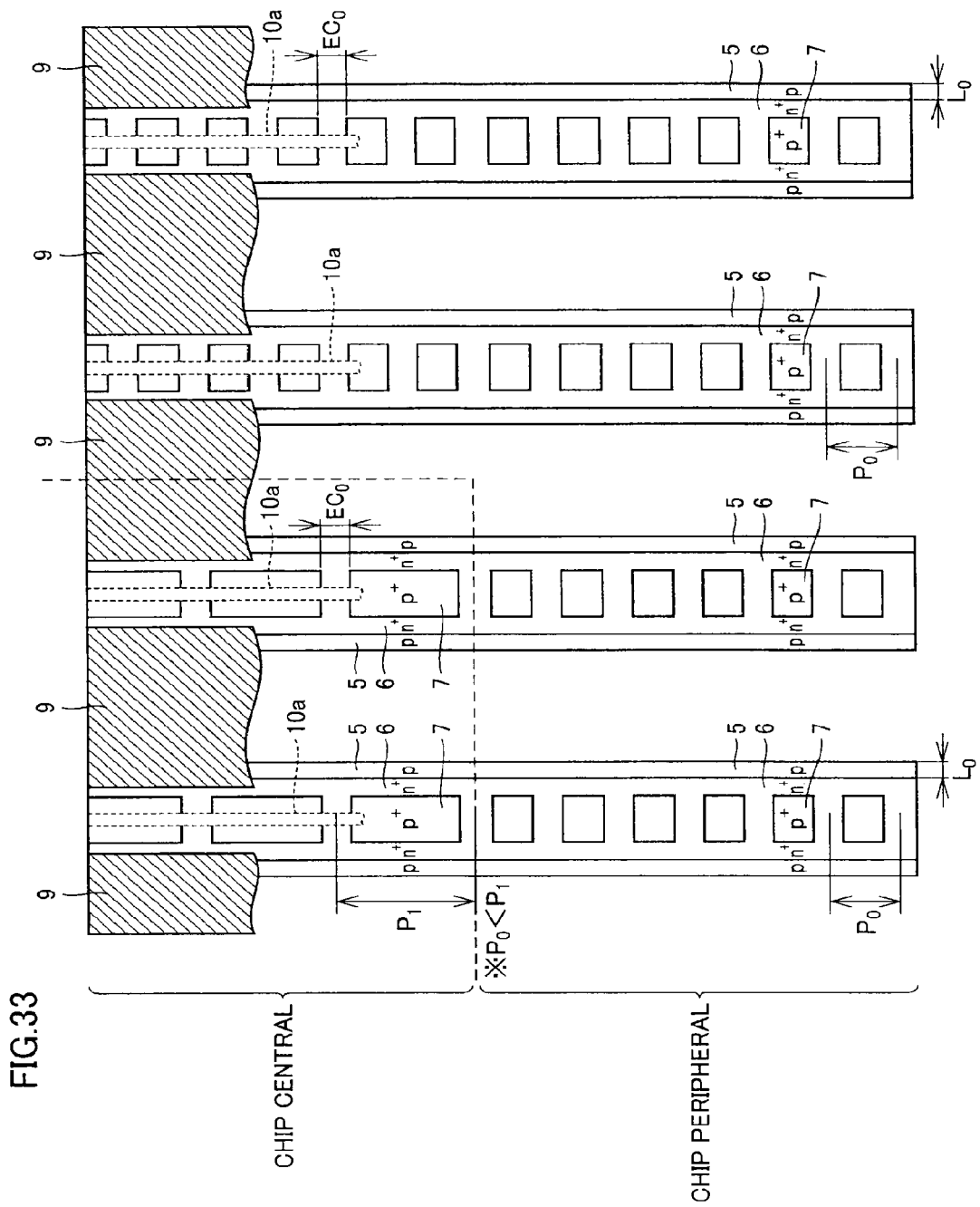
FIG. 33 is a schematic plan showing a planar structure corresponding to the second structure in FIGS. 19 to 21 and having a chip of which contact pitch $P_1$ in its central portion is larger than contact pitch $P_0$ in its peripheral portion.

FIG. 33 shows a planar structure that corresponds to the foregoing second structure, and has the chip (cell region) central portion having a contact pitch $P_1$ larger than contact pitch $P_0$ of the chip (cell region) peripheral portion. Thereby, the current carrying ability of the cell structure in the chip central portion can be lower than that in the chip peripheral portion. The structure shown in FIG. 33 has the chip central portion of which channel length $L_0$ and connection length $EC_0$ are the same as those in the chip peripheral portion.

Figure 34:
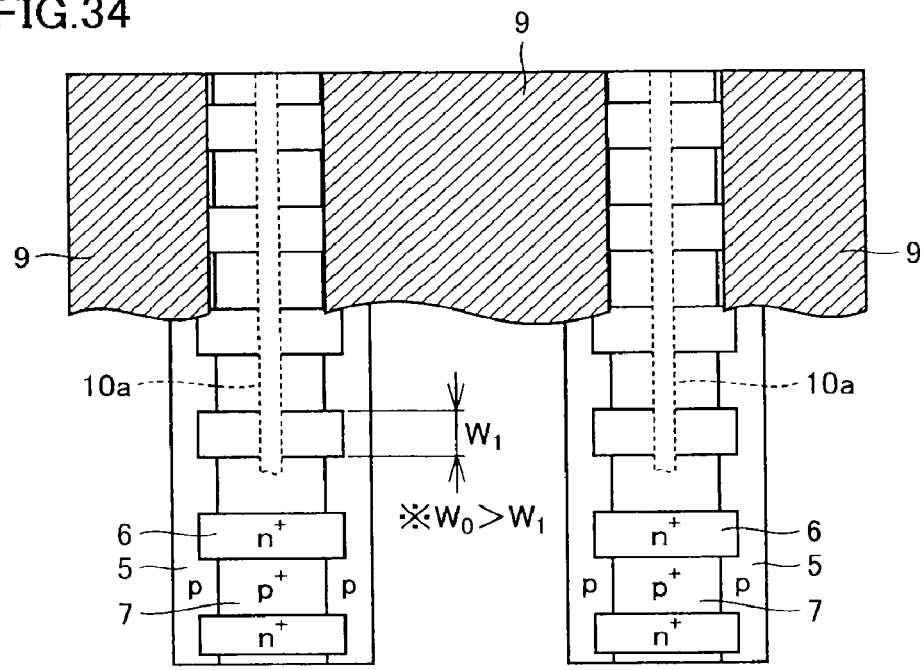
FIG. 34 is a schematic plan showing a structure corresponding to the structure in FIG. 22 and having a channel width of $W_1$ shorter than $W_0$.
Figure 35:
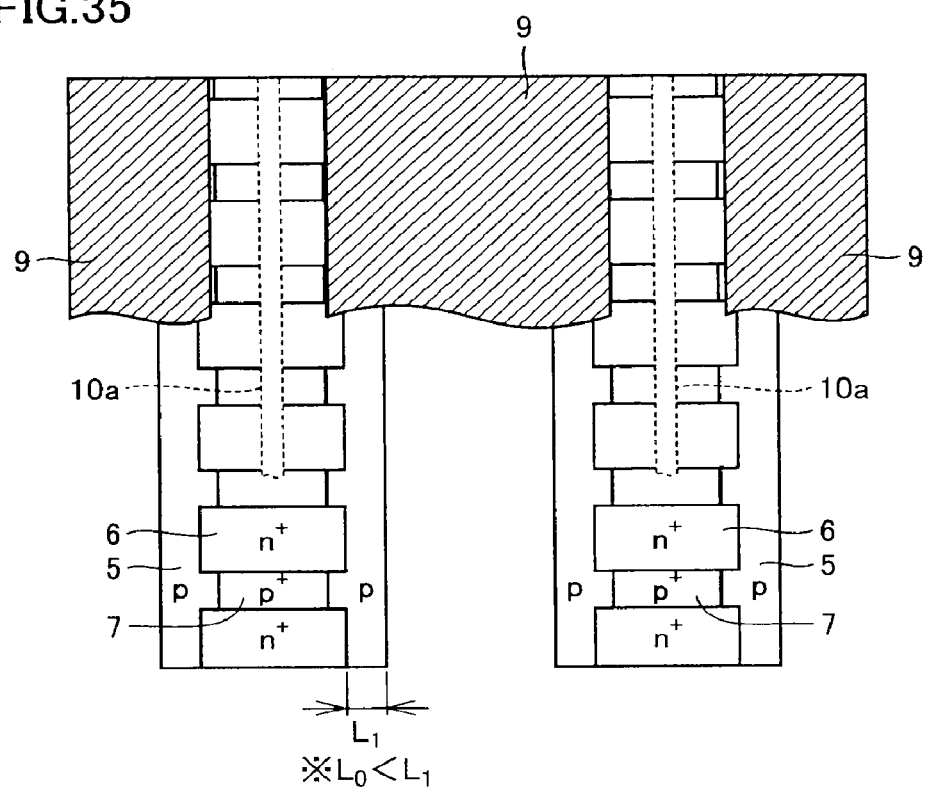
FIG. 35 is a schematic plan showing a structure corresponding to the structure in FIG. 22 and having a channel length of $L_1$ longer than $L_0$.
Figure 36:
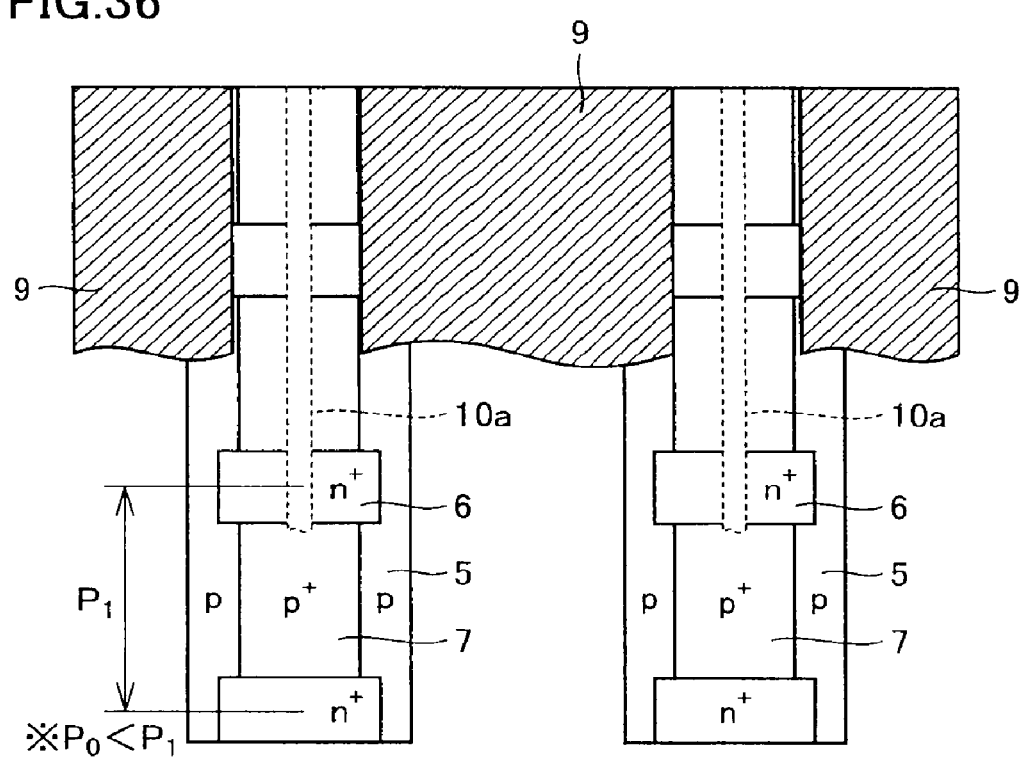
FIG. 36 is a schematic plan showing a structure corresponding to the structure in FIG. 22 and having a contact pitch of $P_1$ larger than $P_0$.

In the foregoing third structure shown in FIGS. 22, 23 and 20, the current carrying ability of the cell structure can be changed by changing at least one of the channel dope concentration of p-type base region 5, channel width $W_1$, channel length $L_1$, the concentration of $n^+$ emitter region 6 and contact pitch $P_0$. FIG. 34 shows a structure in which channel width $W_1$ is shorter than channel width $W_0$ shown in FIG. 22. FIG. 35 shows a structure in which channel length $L_1$ is longer than channel length $L_0$ shown in FIG. 22. FIG. 36 shows a structure in which contact pitch $P_1$ is larger than contact pitch $P_0$ shown in FIG. 22.

Figure 37:
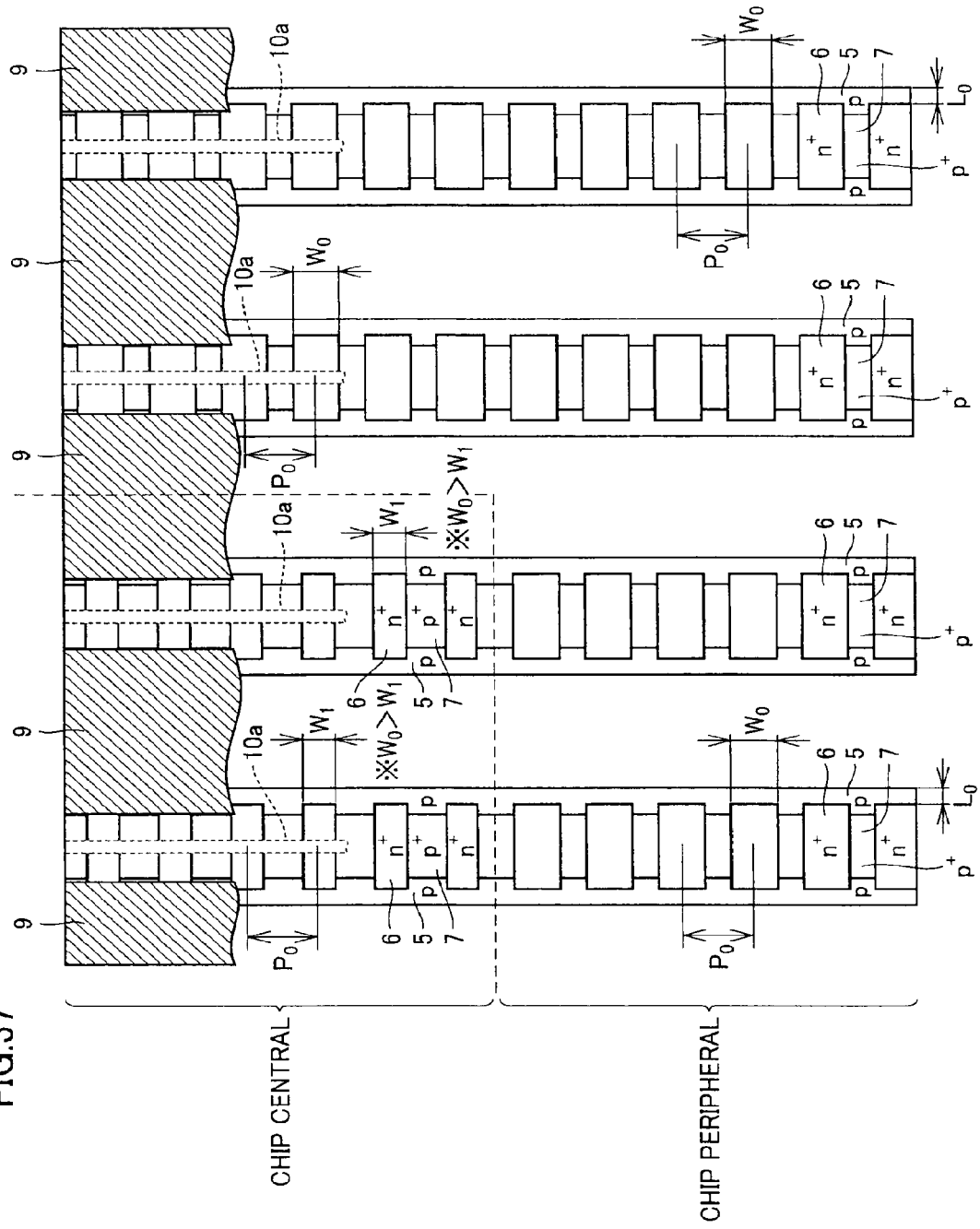
FIG. 37 is a schematic plan showing a planar structure corresponding to the third structure in FIGS. 22, 23 and 20, and having a chip of which channel width $W_1$ in its central portion is smaller than channel width $W_0$ in its peripheral portion.

FIG. 37 shows a planar structure of the foregoing third structure in which the chip (cell region) central portion has channel width $W_1$ smaller than channel width $W_0$ of the chip (cell region) peripheral portion. Thereby, the cell structure in the chip central portion can have the lower current carrying ability than that in the chip peripheral portion. In the structure shown in FIG. 37, channel length $L_0$ and contact pitch $P_0$ in the chip central portion are the same as those in the chip peripheral portion.

Figure 38:
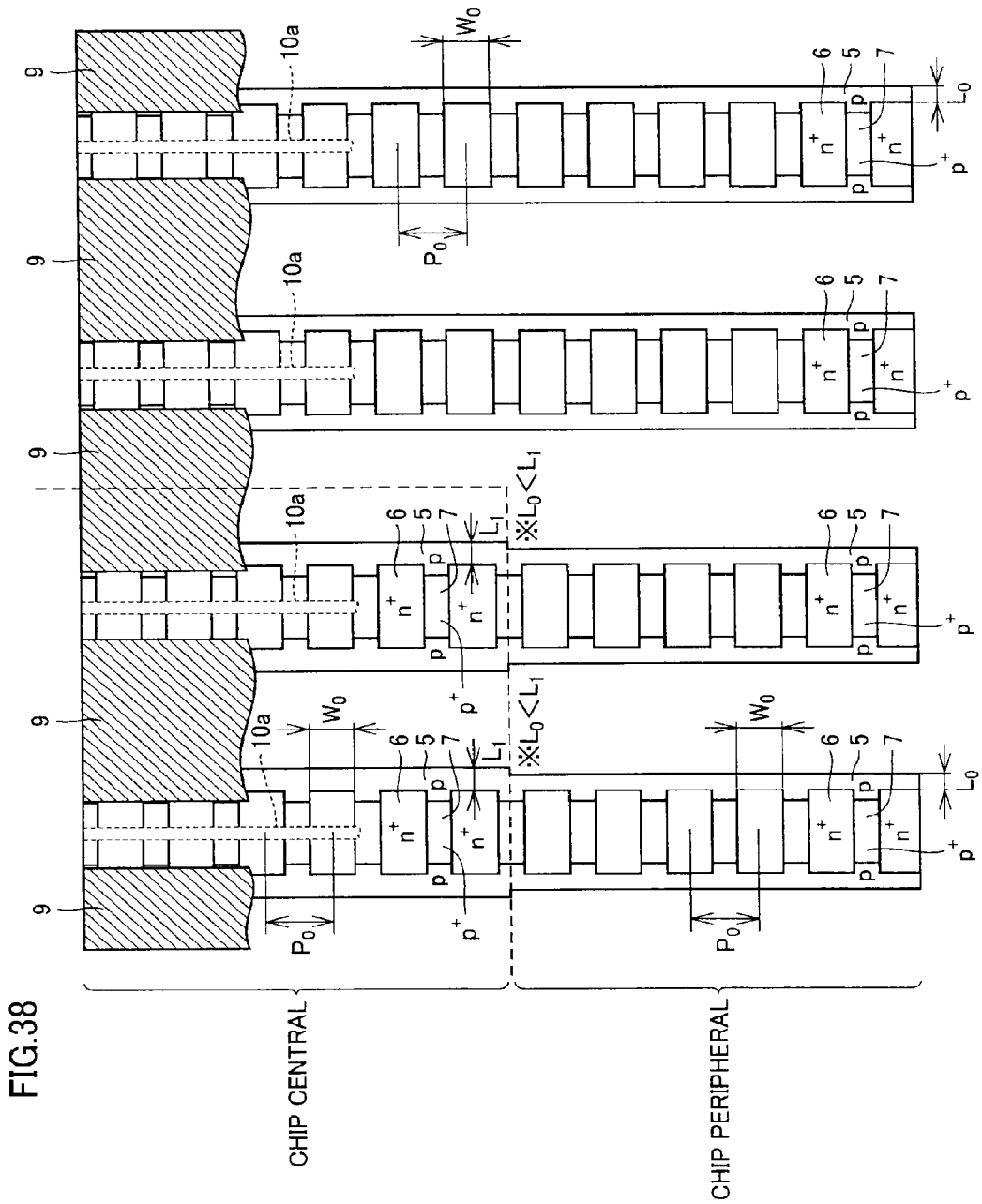
FIG. 38 is a schematic plan showing a planar structure corresponding to the third structure in FIGS. 22, 23 and 20, and having a chip of which channel length $L_1$ in its central portion is larger than channel length $L_0$ in its peripheral portion.

FIG. 38 shows a planar structure of the foregoing third structure in which the chip (cell region) central portion has channel length $L_1$ larger than channel length $L_0$ of the chip (cell region) peripheral portion. Thereby, the cell structure in the chip central portion can have the lower current carrying ability than that in the chip peripheral portion. In the structure shown in FIG. 38, channel width $W_0$ and contact pitch $P_0$ in the chip central portion are the same as those in the chip peripheral portion.

Figure 39:
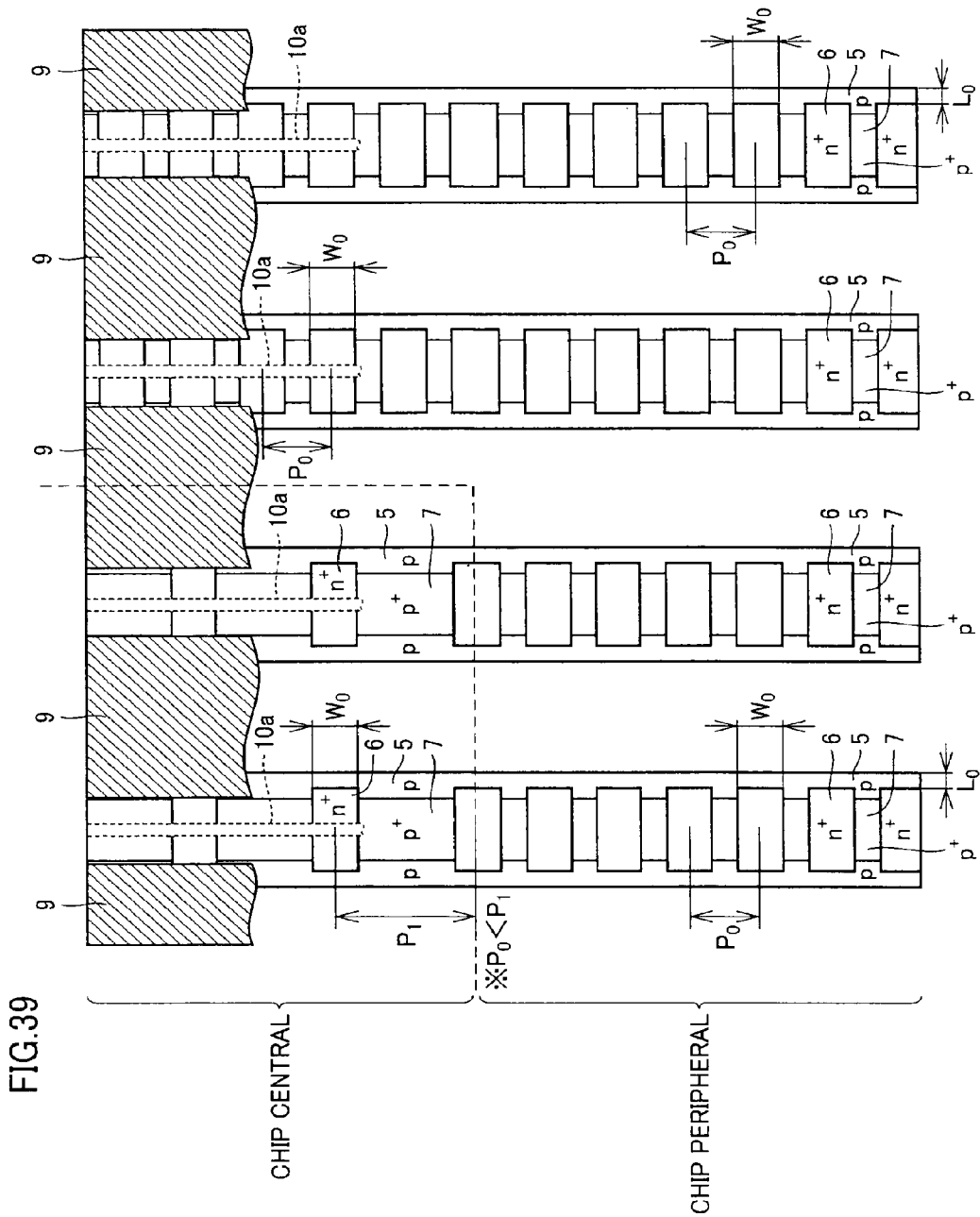
FIG. 39 is a schematic plan showing a planar structure corresponding to the third structure in FIGS. 22, 23 and 20, and having a chip of which contact pitch $P_1$ in its central portion is larger than contact pitch $P_0$ in its peripheral portion.

FIG. 39 shows a planar structure of the foregoing third structure in which the chip (cell region) central portion has contact pitch $P_1$ larger than contact pitch $P_0$ of the chip (cell region) peripheral portion. Thereby, the cell structure in the chip central portion can have the lower current carrying ability than that in the chip peripheral portion. In the structure shown in FIG. 39, channel width $W_0$ and channel length $L_0$ in the chip central portion are the same as those in the chip peripheral portion.

Figure 40:
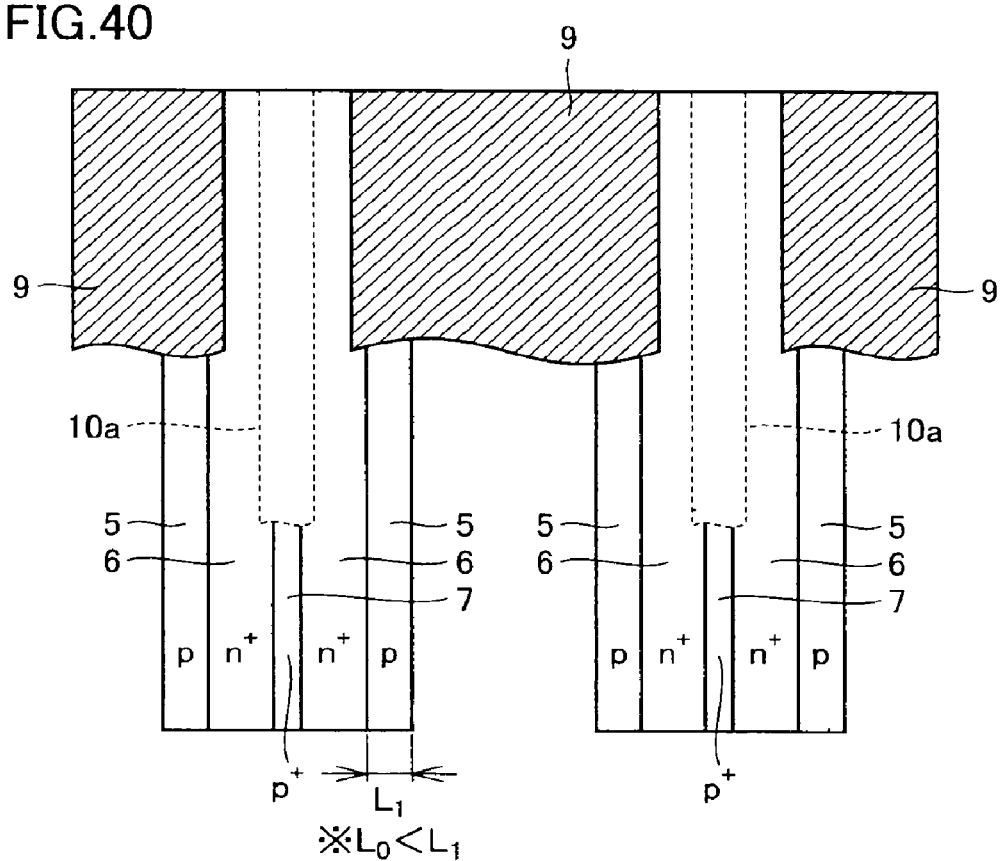
FIG. 40 is a plan showing a structure corresponding to the fourth structure in FIGS. 24 and 25, and having a channel length $L_1$ longer than channel length $L_0$ of the structure in FIG. 24.
Figure 41:
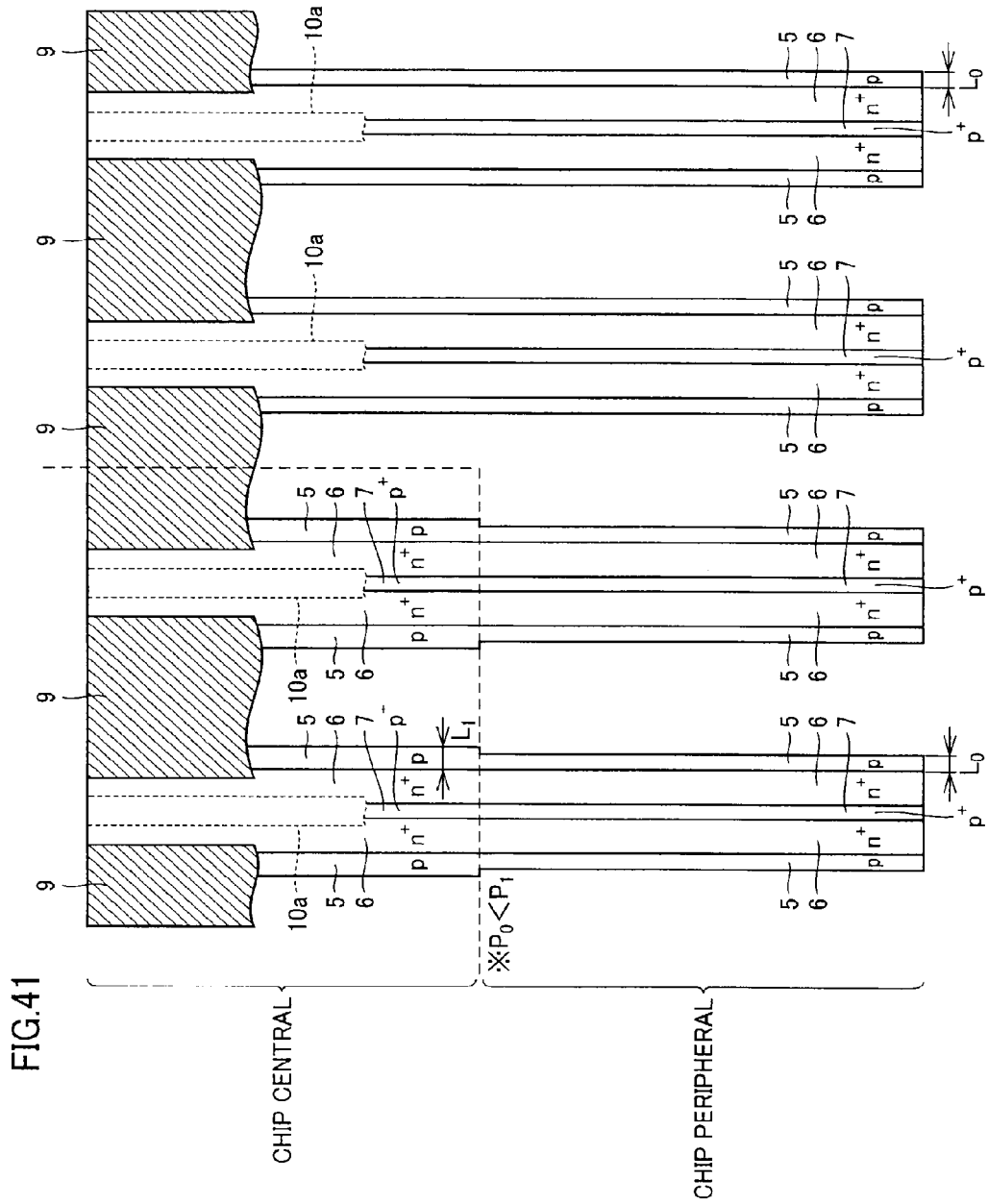
FIG. 41 is a schematic plan showing a planar structure corresponding to the fourth structure in FIGS. 24 and 25, and having a chip of which channel length $L_1$ in its central portion is larger than channel length $L_0$ in its peripheral portion.

In the foregoing fourth structure shown in FIGS. 24 and 25, the current carrying ability of the cell structure can be changed by changing at least one of the channel dope concentration of p-type base region 5, channel length $L_0$ and the concentration of $n^+$ emitter region 6. FIG. 40 shows a structure in which channel length $L_1$ is longer than channel length $L_0$ shown in FIG. 24.

FIG. 37 shows a planar structure of the foregoing fourth structure in which the chip (cell region) central portion has channel length $L_1$ longer than channel length $L_0$ of the chip (cell region) peripheral portion. Thereby, the cell structure in the chip central portion can have the lower current carrying ability than that in the chip peripheral portion.

Then, the method of manufacturing the structure in which channel length $L_1$ of the chip central portion is larger than channel length $L_0$ of the chip peripheral portion will be described below in connection with an example of the foregoing third structure (FIG. 38).

Figure 42:
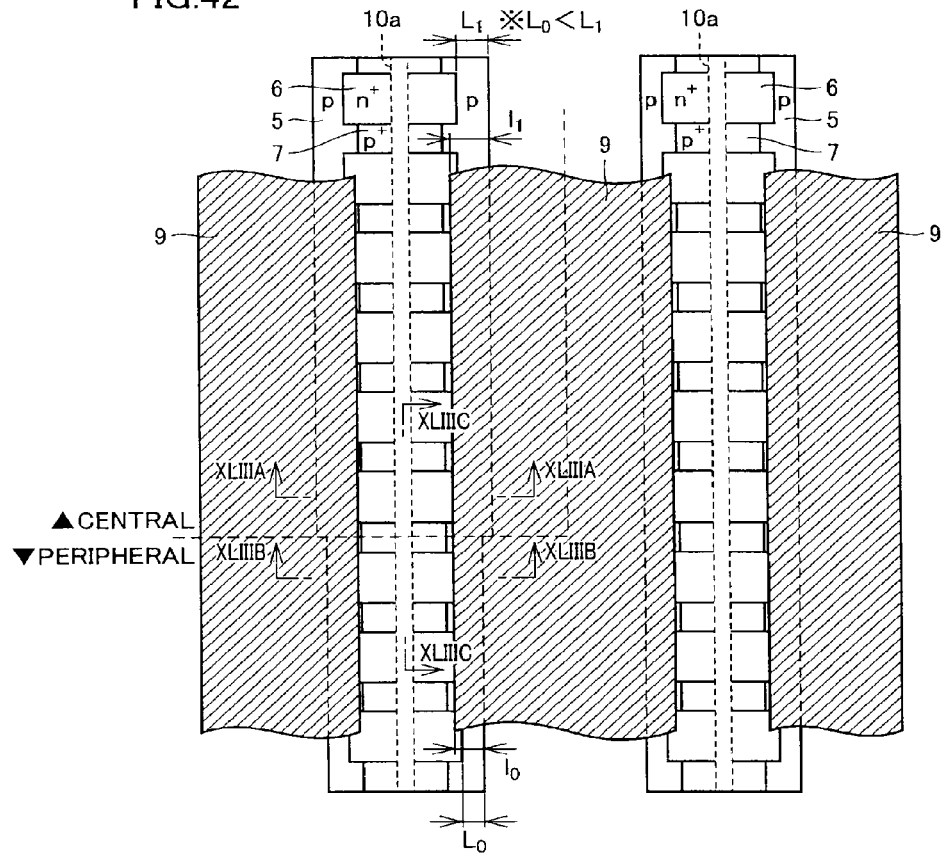
FIG. 42 is a schematic plan showing a third structure of the memory cell (IGBT or power MOSFET) of the planar gate type that can employ the structures of the first to third embodiments.

FIGS. 43A, 44A, 45A, 46A and 47A are schematic cross sections taken along line XLIIIA-XLIIIA in FIG. 42, respectively. FIGS. 43B, 44B, 45B, 46B and 47B are schematic cross sections taken along line XLIIIB-XLIIIB in FIG. 42, respectively. FIGS. 43C, 44C, 45C, 46C and 47C are schematic cross sections taken along line XLIIIC-XLIIIC in FIG. 42, respectively.

Figure 43A:
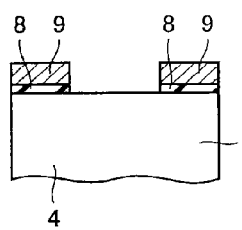
FIGS. 43A, 43B and 43C are schematic sections showing a first step in a manufacturing method of the structure shown in FIG. 42.
Figure 43B:
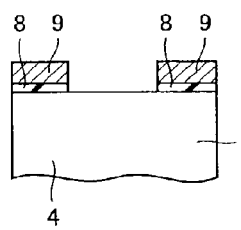
Figure 43C:
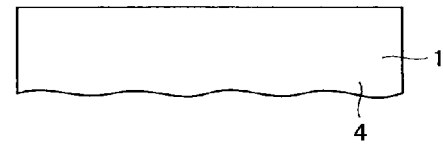

Referring to FIGS. 43A, 43B and 43C gate electrode layer 9 made of polycrystalline silicon is formed on the main surface of semiconductor substrate 1 with gate insulating film 8 therebetween.

Figure 44A:
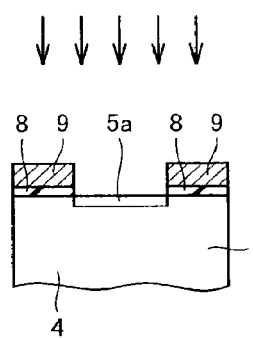
FIGS. 44A, 44B and 44C are schematic sections showing a second step in the manufacturing method of the structure shown in FIG. 42.
Figure 44B:
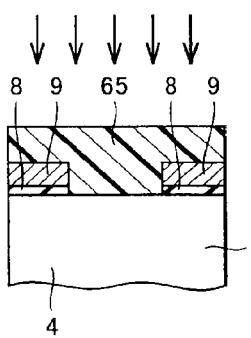
Figure 44C:
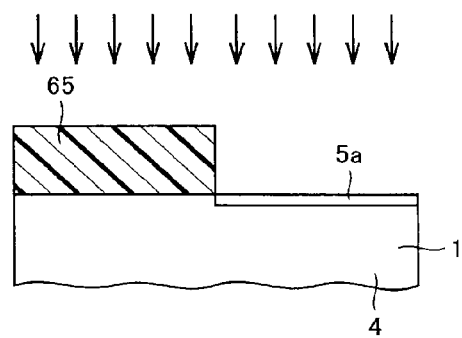

Referring to FIGS. 44A, 44B and 44C a resist pattern 65 is formed over the chip peripheral portion (which is the portion shown in FIG. 44B and on the left side in FIG. 44C) by an ordinary photoengraving technique. Using resist pattern 65 as a mask, ions of p-type impurities are implanted into the exposed main surface of the semiconductor substrate to form an implanted region 5a of p-type impurities. Thereafter, resist pattern 65 is removed by ashing or the like.

Figure 45A:
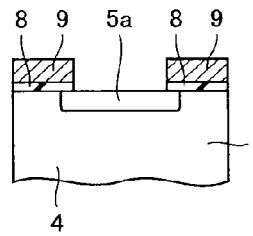
FIGS. 45A, 45B and 45C are schematic sections showing a third step in the manufacturing method of the structure shown in FIG. 42.
Figure 45B:
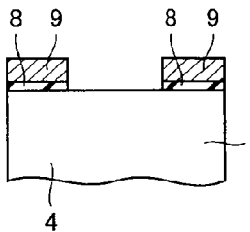
Figure 45C:
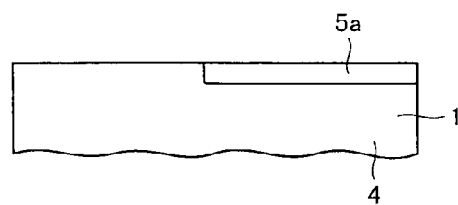

Referring to FIGS. 45A, 45B and 45C thermal processing is performed for activating the p-type impurities in implanted region 5a. Thereby, the p-type impurities in implanted region 5a diffuse, and implanted region 5a slightly expands upward and downward.

Figure 46A:
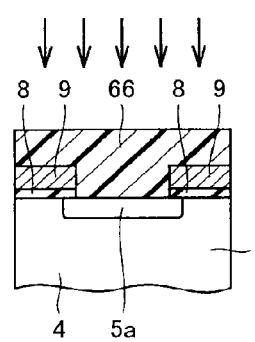
FIGS. 46A, 46B and 46C are schematic sections showing a fourth step in the manufacturing method of the structure shown in FIG. 42.
Figure 46B:
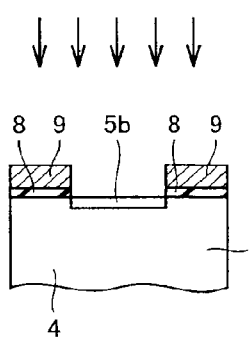
Figure 46C:
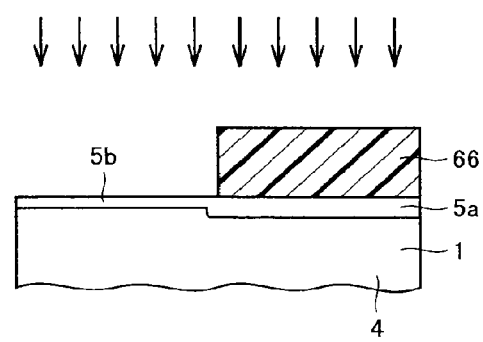

Referring to FIGS. 46A, 46B and 46C a resist pattern 66 covering the chip central portion ((which is the portion shown in FIG. 46A and on the right side in FIG. 46C) by the ordinary photoengraving technique. Using resist pattern 66 as a mask, ions of p-type impurities are implanted into the exposed main surface of the semiconductor substrate to form an implanted region 5b of p-type impurities. This implanted region 5b is shallower than implanted region 5a. Thereafter, resist pattern 65 is removed by ashing or the like.

Referring to FIGS. 47A, 47B and 47C thermal processing is performed for activating the p-type impurities in implanted region 5b. Thereby, the p-type impurities in implanted regions 5a and 5b diffuse to expand slightly implanted region 5a and 5b upward and downward, respectively.

The above processing forms p-type base region 5 formed of implanted region 5b and implanted region 5a that is deeper and wider than implanted region 5b. Thus, as shown in FIG. 47C, a depth $X_1$ of implanted region 5a is larger than a depth $X_{10}$ of implanted region 5b. Also, as shown in FIGS. 47A and 47B, a width $l_1$ of a portion of implanted region 5a expanding under gate electrode layer 9 is larger than a width $l_2$ of implanted region 5b expanding under gate electrode layer 9. As shown in FIG. 42, therefore, gate length $L_1$ of the central portion of the chip can be larger than gate length $L_0$ of the peripheral portion of the chip.

Each of the foregoing first to fourth structures may be applied to the IGBT and may also be applied to the power MOSFET.

The four structures have been described in connection with the memory cell (IGBT or power MOSFET) of the planar gate type. However, the structures of the foregoing first to third embodiments may be applied, e.g., to the memory cell of the trench gate type.

For example, the memory cell (IGBT or power MOSFET) of the trench gate type that can employ the structures of the foregoing first to third embodiments may have the following four structures.

Figure 49:
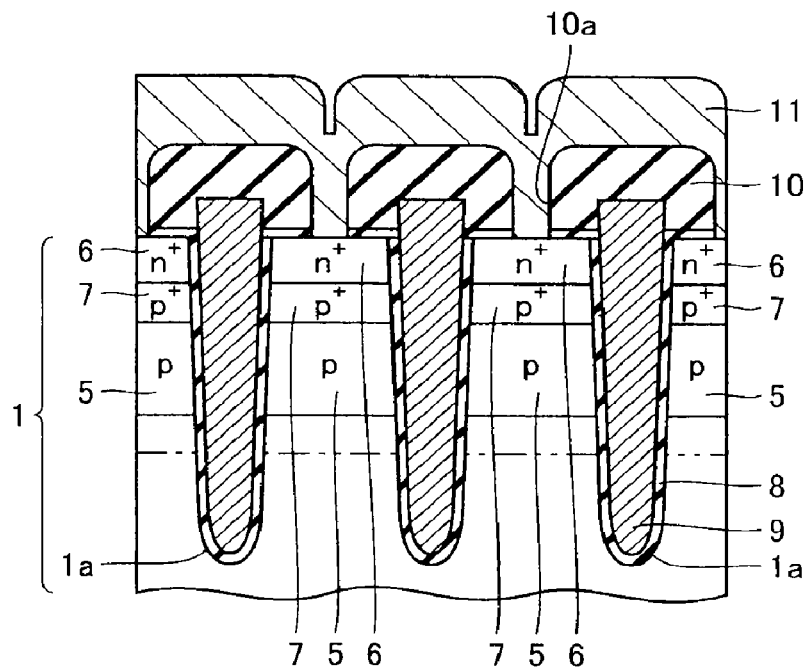
FIG. 49 is a schematic cross section taken along line XLIX-XLIX in FIG. 48.
Figure 50:
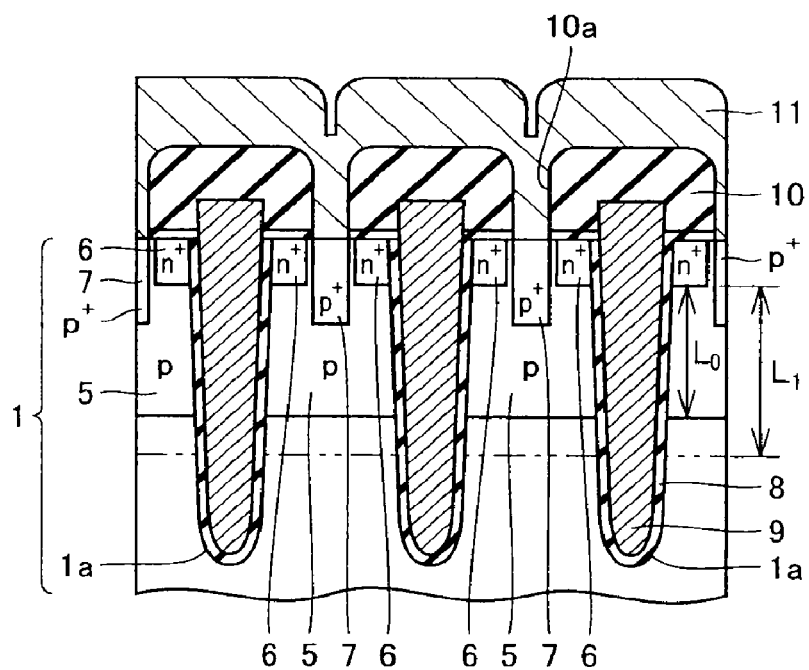
FIG. 50 is a schematic cross section taken along line L-L in FIG. 48.
Figure 51:
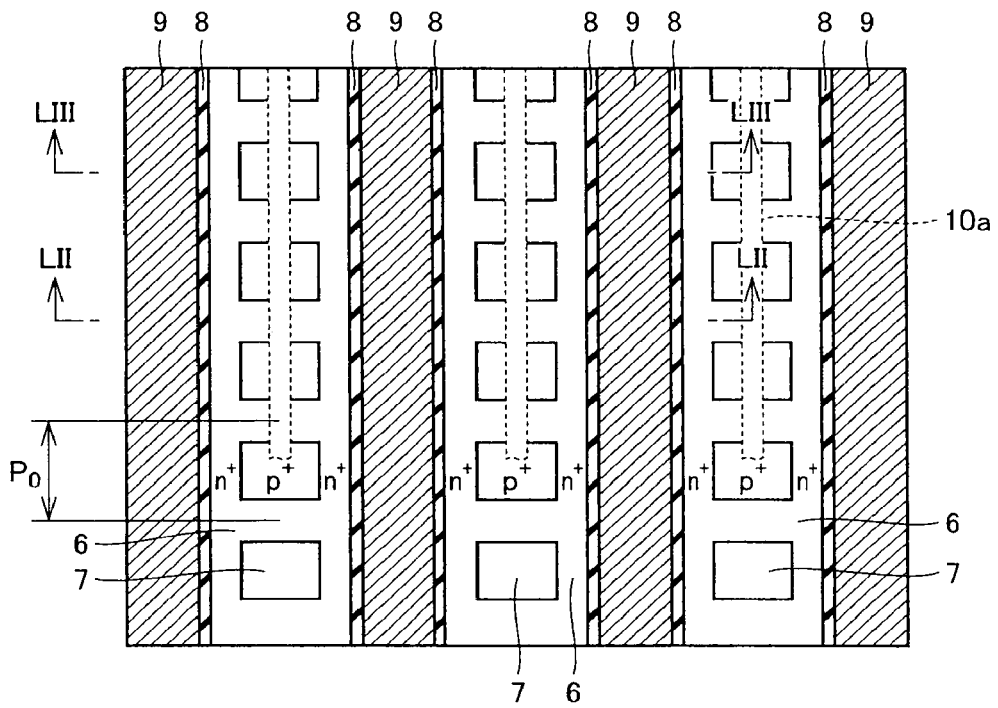
FIG. 51 is a schematic plan showing a second structure of the memory cell (IGBT or power MOSFET) of the trench gate type that can employ the structures of the first to third embodiments.
Figure 52:
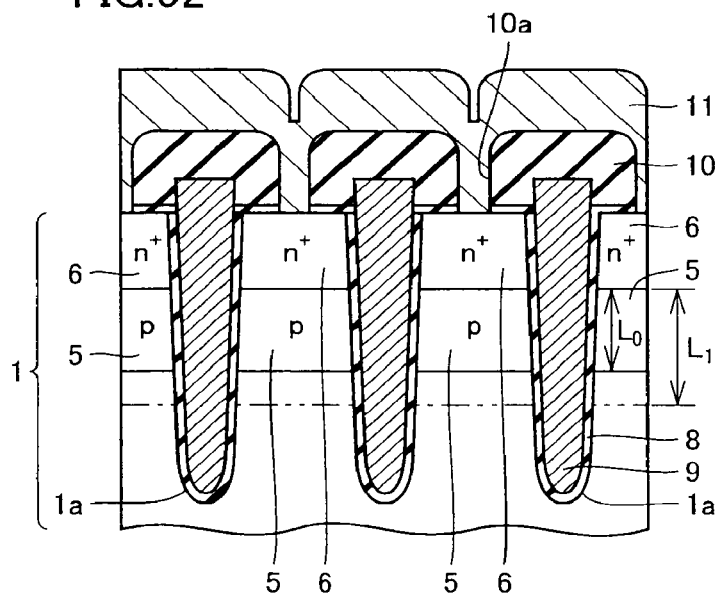
FIG. 52 is a schematic cross section taken along line LII-LII in FIG. 51.
Figure 53:
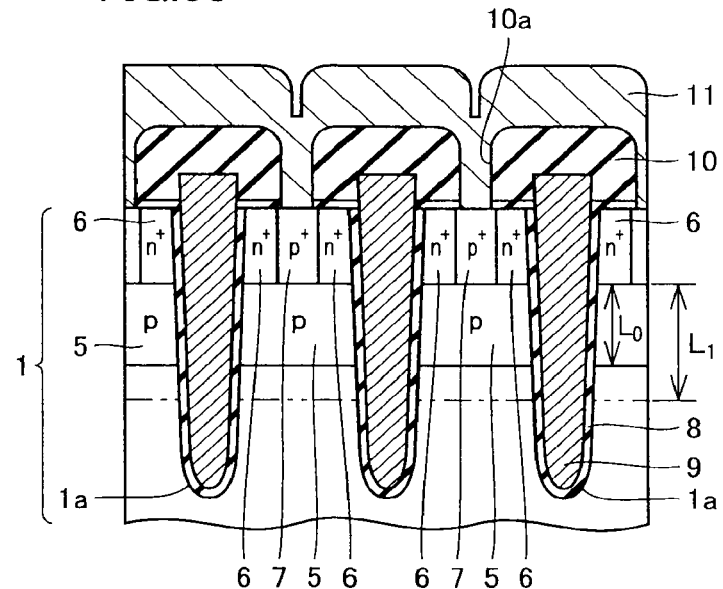
FIG. 53 is a schematic cross section taken along line LIII-LIII in FIG. 51.
Figure 54:
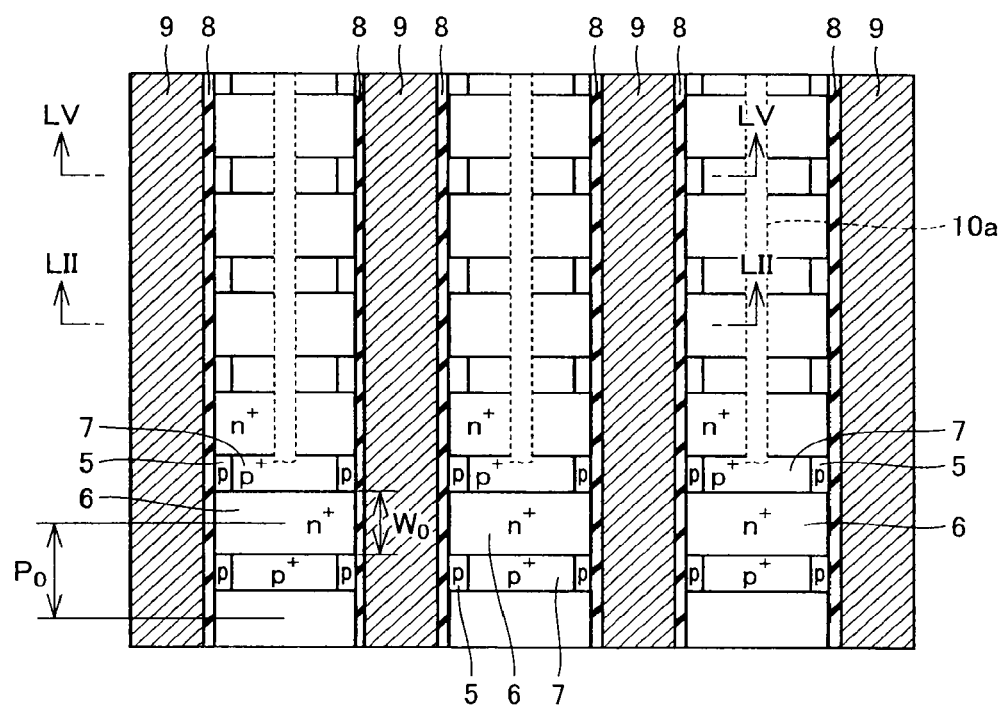
FIG. 54 is a schematic plan showing a third structure of the memory cell (IGBT or power MOSFET) of the trench gate type that can employ the structures of the first to third embodiments.
Figure 55:
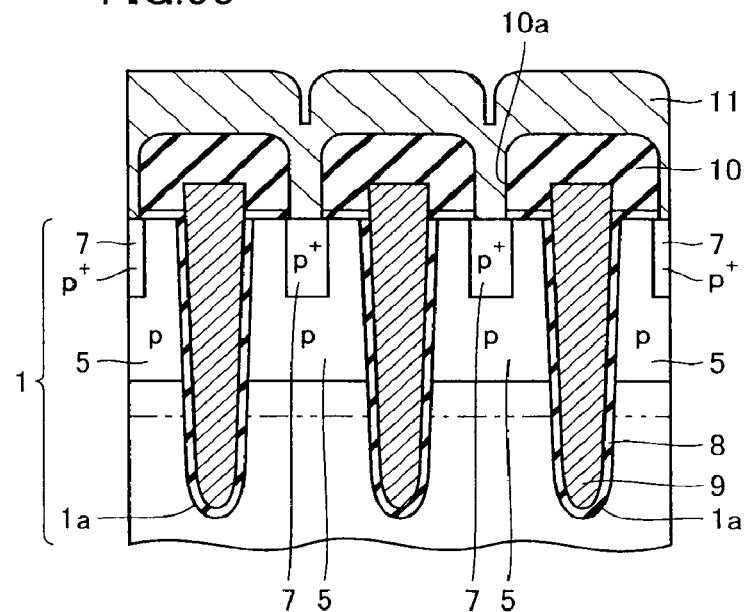
FIG. 55 is a schematic cross section taken along line LV-LV in FIG. 54.
Figure 56:
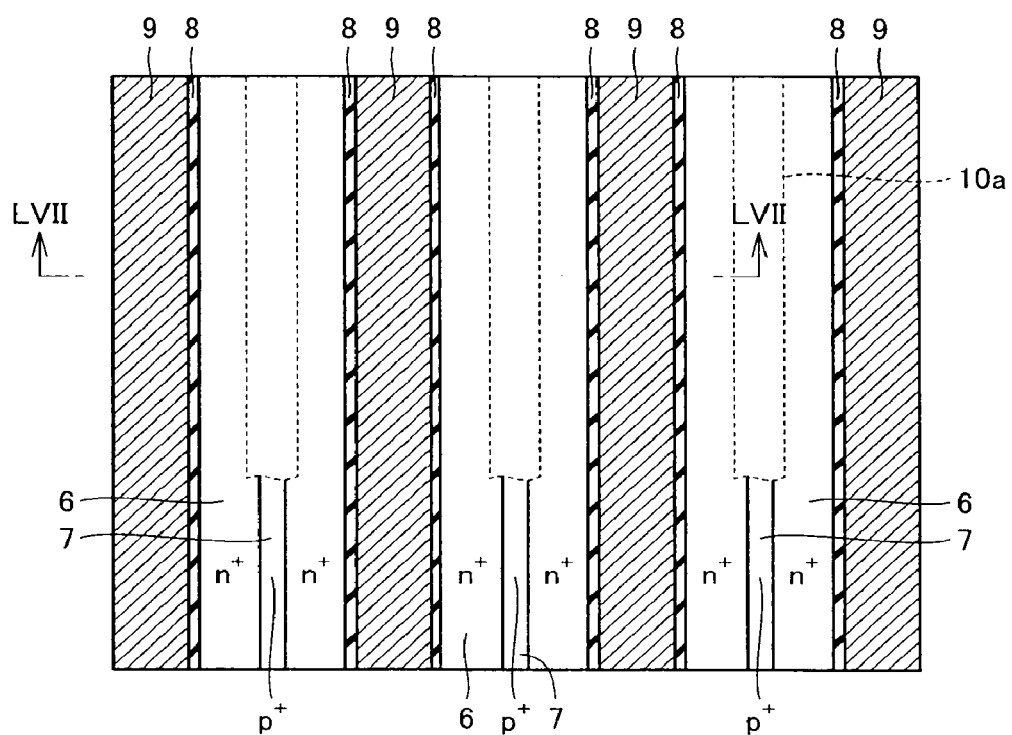
FIG. 56 is a schematic plan showing a fourth structure of the memory cell (IGBT or power MOSFET) of the trench gate type that can employ the structures of the first to third embodiments.
Figure 57:
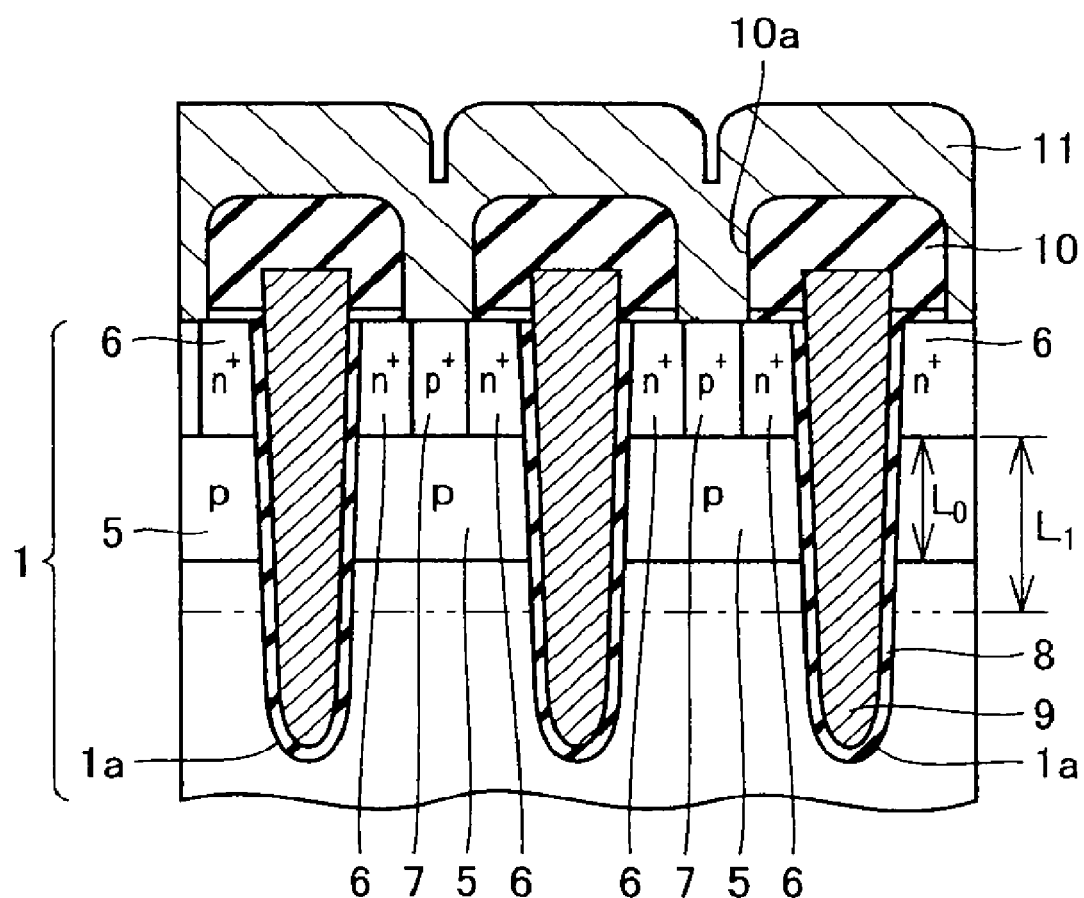
FIG. 57 is a schematic cross section taken along line LVII-LVII in FIG. 56.

FIGS. 48-50 show the first structure of the trench gate type, FIGS. 51-53 shows the second structure, FIGS. 54 and 55 show the third structure and FIGS. 56 and 57 show the fourth structure.

The first structure of the trench gate type is shown in FIG. 48, which is a schematic plan showing the structure of the memory cell of the trench gate type. FIGS. 49 and 50 are schematic cross sections taken along lines XLIX-XLIX and L-L in FIG. 48, respectively.

Referring to FIGS. 48-50, $n^+$ emitter region 6 extending in a ladder-like form in a plan view is formed at the main surface of semiconductor substrate 1 and particularly in the region where p-type base region 5 is formed. $p^+$ region 7 extends in the same direction as the ladder of $n^+$ emitter region 6, and particularly extends continuously through a central portion of the ladder in the plan view. This $n^+$ region 7 is deeper than $n^+$ emitter region 6 with respect to the main surface of semiconductor substrate 1.

Semiconductor substrate 1 is provided at the main surface with trench 1a, which extends through $n^+$ emitter region 6, $p^+$ region 7 and p-type base region 5 and reaches $n^-$ epitaxial region 4. Gate insulating film 8 is formed along the wall surface of trench 1a, and gate electrode layer 9 fills trench 1a. As shown in FIG. 50, gate electrode layer 9 thus formed is opposed to p-type base region 5 located between $n^-$ epitaxial region 4 and $n^+$ emitter region 6 with gate insulating film 8 interposed therebetween.

Insulating film 10 is provided with contact hole 10a reaching the surfaces of the rung of the ladder of $n^+$ emitter region 6 and $p^+$ region 7. Thereby, emitter pad 11 is electrically connected to $n^+$ emitter region 6 and $p^+$ region 7 through contact hole 10a.

For the sake of illustration, FIG. 16 does not show a part of contact holes 10a.

The second structure of the trench gate type is shown in FIG. 51, which is a schematic plan showing the structure of the memory cell of the trench gate type. FIGS. 52 and 53 are schematic cross sections taken along lines LII-LII and LIII-LIII in FIG. 51, respectively.

Referring to FIGS. 51-53, the second structure of the trench gate type differs from the foregoing first structure of the trench gate type in that $p^+$ region 7 having an island form is formed at the main surface of semiconductor substrate 1 and particularly is surrounded by two frames and two rungs of the ladder defined by $n^+$ emitter region 6, and that $n^+$ emitter region 6 and $p^+$ region 7 have substantially the same depth.

Structures other than the above are substantially the same as those of the foregoing first structure of the trench gate type. Therefore, the same components bear the same reference numbers, and description thereof is not repeated. FIG. 56 does not show a part of contact holes 10*a* for the sake of illustration.

The third structure of the trench gate type is shown in FIG. 54, which is a schematic plan showing the structure of the memory cell of the trench gate type. FIG. 55 is a schematic cross section taken along line LV-LV in FIG. 54. The sectional structure along line LII-LII in FIG. 54 corresponds to that in FIG. 52.

Referring to FIGS. 54, 55 and 52, the third structure of the trench gate type differs from the foregoing first structure of the trench gate type in that $n^+$ emitter regions 6 and $p^+$ regions 7 are arranged alternately to each other at the main surface of semiconductor substrate 1 and particularly within the region where p-type base region 5 is formed, and that $n^+$ emitter region 6 and $p^+$ region 7 have substantially the same depth.

Structures other than the above are substantially the same as those of the first structure of the trench gate type. Therefore, the same components bear the same reference numbers, and description thereof is not repeated. FIG. 54 does not show a part of contact holes 10*a* for the sake of illustration.

The fourth structure of the trench gate type is shown in FIG. 56, which is a schematic plan showing the structure of the memory cell of the trench gate type. FIG. 57 is a schematic cross section taken along line LVII-LVII in FIG. 56.

Referring to FIGS. 56 and 57, the fourth structure of the trench gate type differs from the foregoing first structure of the trench gate type in that $n^+$ emitter regions 6 and $p^+$ regions 7 are arranged parallel to each other at the main surface of semiconductor substrate 1 and particularly within the region where p-type base region 5 is formed, and that $n^+$ emitter region 6 and $p^+$ region 7 have substantially the same depth.

Structures other than the above are substantially the same as those of the first structure of the trench gate type. Therefore, the same components bear the same reference numbers, and description thereof is not repeated. FIG. 56 does not show a part of contact holes 10*a* for the sake of illustration.

In FIGS. 48 and 54 showing the respective structures, size $W_0$ represents the channel width, and each of sizes $L_0$ and $L_1$ in FIGS. 50, 52, 53 and 57 represents the channel length. Size $P_0$ in FIGS. 48, 51 and 54 represents the contact pitch of $n^+$ emitter regions 6 and emitter pads 11.

In the first structure of the trench gate type shown in FIGS. 48-50, the current carrying ability of the cell structure can be changed by changing at least one of the channel dope concentration of p-type base region 5, channel width $W_0$, channel length $L_0$, the concentration of $n^+$ emitter region 6 and contact pitch $P_0$. For example, as shown in FIG. 50, channel length $L_0$ can be changed into channel length $L_1$ by changing the depth of p-type base region 5.

In the second structure of the trench gate type shown in FIGS. 51-53, the current carrying ability of the cell structure can be changed by changing at least one of the channel dope concentration of p-type base region 5, channel length $L_0$, concentration of $n^+$ emitter region 6 and contact pitch $P_0$. For example, as shown in FIGS. 52 and 53, channel length $L_0$ can be changed into channel length $L_1$ by changing the depth of p-type base region 5.

In the foregoing third structure of the trench gate type shown in FIGS. 54, 55 and 52, the current carrying ability of the cell structure can be changed by changing at least one of the channel dope concentration of p-type base region 5, channel width $W_1$, channel length $L_0$, the concentration of $n^+$ emitter region 6 and contact pitch $P_0$. For example, as shown in FIG. 52, channel length $L_0$ can be changed into channel length $L_1$ by changing the depth of p-type base region 5.

In the foregoing fourth structure of the trench gate type shown in FIGS. 56 and 57, the current carrying ability of the cell structure can be changed by changing at least one of the channel dope concentration of p-type base region 5, channel length $L_0$ and the concentration of $n^+$ emitter region 6. For example, as shown in FIG. 57, channel length $L_0$ can be changed into channel length $L_1$ by changing the depth of p-type base region 5.

In any one of the first to fourth structures of the trench gate type, as described above, the current carrying ability of the cell structure in the chip (cell region) central portion can be set lower than that in the chip (cell region) peripheral portion by changing the current carrying abilities of the cell structures in the chip central portion and the chip peripheral portion.

Each of the first to fourth structures of the planar gate type and each of the first to fourth structures of the trench gate type have been described in connection with the case where the cell structure in the chip (cell region) central portion has the current carrying ability different from that of the cell structure in the chip (cell region) peripheral portion. Similarly to this structure, the cell structure immediately under the wire joining portion can be configured to have the current carrying ability different from that of the other cell structures. Also, the cell structures located immediately under the wires of different lengths may be configured to have different current carrying abilities, respectively.

The invention can be applied particularly advantageously to the power semiconductor device having the vertical power device.

Although the present invention has been described and illustrated in detail, it is clearly understood that the same is by way of illustration and example only and is not to be taken by way of limitation, the scope of the present invention being interpreted by the terms of the appended claims.

What is claims is:

1. A power semiconductor device comprising:
a semiconductor substrate having a main surface; and
a plurality of cell structures of a vertical power device formed at said semiconductor substrate,
wherein one cell structure included in said plurality of cell structures and located immediately under a wire joining portion of said main surface has a lower current carrying ability than an other cell structure included in said plurality of cell structures and not located immediately under said wire joining portion, and no cell structure of said vertical power device having a higher current carrying ability than said one cell structure immediately underlies said wire joining portion.

2. The power semiconductor device according to claim 1, wherein each of said one cell structure and said other cell structure has an insulated gate field-effect transistor, and said one cell structure has a larger threshold voltage than said other cell structure.

3. The power semiconductor device according to claim 1, wherein each of said one cell structure and said other cell structure has an insulated gate field-effect transistor, and said one cell structure has a smaller channel width than said other cell structure.

4. The power semiconductor device according to claim 1, wherein each of said one cell structure and said other cell structure has an insulated gate field-effect transistor, and said one cell structure has a larger channel length than said other cell structure.

5. The power semiconductor device according to claim 1, wherein each of said one cell structure and said other cell structure is an IGBT having an emitter region, and said emitter region of said one cell structure has a larger diffusion resistance than said emitter region of said other cell structure.

6. A power semiconductor device comprising:
a semiconductor substrate having a main surface; and
a plurality of cell structures of a vertical power device formed at said semiconductor substrate,
wherein a plurality of wire joining portions including one wire bonded portion and an other wire bonded portion are present at said main surface, and
one of said plurality of cell structures located immediately under said one wire bonded portion has a current carrying ability different from that of the an other of said cell structures located immediately under said other wire bonded portion.

7. The power semiconductor device according to claim 6, wherein each of said one cell structure and said other cell structure has an insulated gate field-effect transistor, and said one cell structure has a larger threshold voltage than said other cell structure.

8. The power semiconductor device according to claim 6, wherein each of said one cell structure and said other cell structure has an insulated gate field-effect transistor, and said one cell structure has a smaller channel width than said other cell structure.

9. The power semiconductor device according to claim 6, wherein each of said one cell structure and said other cell structure has an insulated gate field-effect transistor, and said one cell structure has a larger channel length than said other cell structure.

10. The power semiconductor device according to claim 6, wherein each of said one cell structure and said other cell structure is an IGBT having an emitter region, and said emitter region of said one cell structure has a larger diffusion resistance than said emitter region of said other cell structure.

11. The power semiconductor device according to claim 6, wherein each of the wire bonded portions are electrically connected to a respective impurity concentration region of the cells formed in said main surface, and through said impurity concentration regions switched current passes.

12. The power semiconductor device according to claim 6, further comprising:
a first wire bonded to said one wire bonded portion; and
a second wire bonded to said other wire bonded portion, wherein
said first wire and has an interconnection length longer than an interconnection length of said second wire, and said currently carrying ability of said one cell structure is lower than said current carrying ability of said other cell structure.

* * * * *